United States Patent
Isobe et al.

(10) Patent No.: US 9,755,084 B2
(45) Date of Patent: Sep. 5, 2017

(54) MULTI-LEVEL STACKED TRANSISTOR DEVICE INCLUDING CAPACITOR AND DIFFERENT SEMICONDUCTOR MATERIALS

(71) Applicant: Semiconductor Energy Laboratory Co., Ltd., Atsugi-shi, Kanagawa-ken (JP)

(72) Inventors: Atsuo Isobe, Kanagawa (JP); Yasuyuki Arai, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 367 days.

(21) Appl. No.: 13/755,921

(22) Filed: Jan. 31, 2013

(65) Prior Publication Data

US 2013/0207112 A1    Aug. 15, 2013

(30) Foreign Application Priority Data

Feb. 9, 2012  (JP) ................................ 2012-026737

(51) Int. Cl.
   *H01L 29/786* (2006.01)
   *H01L 27/12* (2006.01)

(52) U.S. Cl.
   CPC .... *H01L 29/78693* (2013.01); *H01L 27/1225* (2013.01); *H01L 27/1255* (2013.01)

(58) Field of Classification Search
   CPC ............. H01L 23/5223; H01L 27/0629; H01L 27/0688; H01L 27/0727; H01L 27/0733;
   (Continued)

(56) References Cited

U.S. PATENT DOCUMENTS 5,731,856 A   3/1998  Kim et al.
5,744,864 A   4/1998  Cillessen et al.
(Continued)

FOREIGN PATENT DOCUMENTS

EP    1 737 044 A1    12/2006
EP    2 226 847 A2     9/2010
(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Matthew Landau
*Assistant Examiner* — Mark Hatzilambrou
(74) *Attorney, Agent, or Firm* — Fish & Richardson P.C.

(57) ABSTRACT

A semiconductor device having a novel structure is provided in which a transistor including an oxide semiconductor and a transistor including a semiconductor material which is not an oxide semiconductor are stacked. Further, a semiconductor device in which a semiconductor element and a capacitor are formed efficiently is provided. In a semiconductor device, a first semiconductor element layer including a transistor formed using a semiconductor material which is not an oxide semiconductor, such as silicon, and a second semiconductor element layer including a transistor formed using an oxide semiconductor are stacked. A capacitor is formed using a wiring layer, or a conductive film or an insulating film which is in the same layer as a conductive film or an insulating film of the second semiconductor element layer.

15 Claims, 21 Drawing Sheets

(58) Field of Classification Search
CPC ........... H01L 27/10808; H01L 27/1203; H01L 27/1255; H01L 29/66757; H01L 27/1225; H01L 29/78693
USPC .................... 257/68, 71, 296, 300, 306, 535
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,550,771 B2 | 6/2009 | Nagata |
| 7,674,650 B2 | 3/2010 | Akimoto et al. |
| 7,732,819 B2 | 6/2010 | Akimoto et al. |
| 8,406,038 B2 | 3/2013 | Saito et al. |
| 8,525,178 B2 | 9/2013 | Ichiryu et al. |
| 9,007,813 B2 | 4/2015 | Saito et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0253149 A1* | 11/2005 | Yamazaki ......... G02F 1/136213 257/72 |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0235777 A1* | 10/2007 | Nagata ........................ 257/288 |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2011/0089417 A1 | 4/2011 | Yamazaki et al. |
| 2011/0101334 A1* | 5/2011 | Yamazaki ........................ 257/43 |
| 2011/0101351 A1 | 5/2011 | Yamazaki |
| 2011/0176355 A1 | 7/2011 | Furutani et al. |
| 2011/0284838 A1 | 11/2011 | Saito |
| 2012/0037972 A1 | 2/2012 | Yoneda |
| 2012/0213000 A1 | 8/2012 | Takemura |
| 2013/0271220 A1 | 10/2013 | Takahashi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 05-326879 A | 12/1993 |
| JP | 06-302783 A | 10/1994 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165529 A | 6/2006 |
| JP | 2007-281155 A | 10/2007 |
| JP | 2010-141230 A | 6/2010 |
| JP | 2011-258303 A | 12/2011 |
| WO | 2004/114391 A1 | 12/2004 |
| WO | WO-2011/142081 | 11/2011 |

OTHER PUBLICATIONS

Asaoka, Y et al., "29.1: Polarizer-Free Reflective LCD Combined With Ultra Low-Power Driving Technology," SID Digest '09 : SID

(56) References Cited

OTHER PUBLICATIONS

International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using CASTEP," Zeitschrift fur Kristallographie, 2005, vol. 220, pp. 567-570.
Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced at Room.Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDs," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda, T et al., "Full-Functional System Liquid Crystal Display Using Cg-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.
Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.
Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "SUFTLA Flexible Microelectronics on Their Way to Business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of the 6th International Display Workshops, Dec. 3, 2008, pp. 581-584.
Nakamura, "Synthesis of Homologous Compound with New Long-Period Structure," NIRIM Newsletter, Mar. 1995, vol. 150, pp. 1-4 with English translation.
Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

(56) References Cited

OTHER PUBLICATIONS

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn-Oxide TFTs With a Novel Passivation Layer," SID Digest '09 : SID International Symposium Digest of Technical Papers, May 31, 2009, pp. 284-287.

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

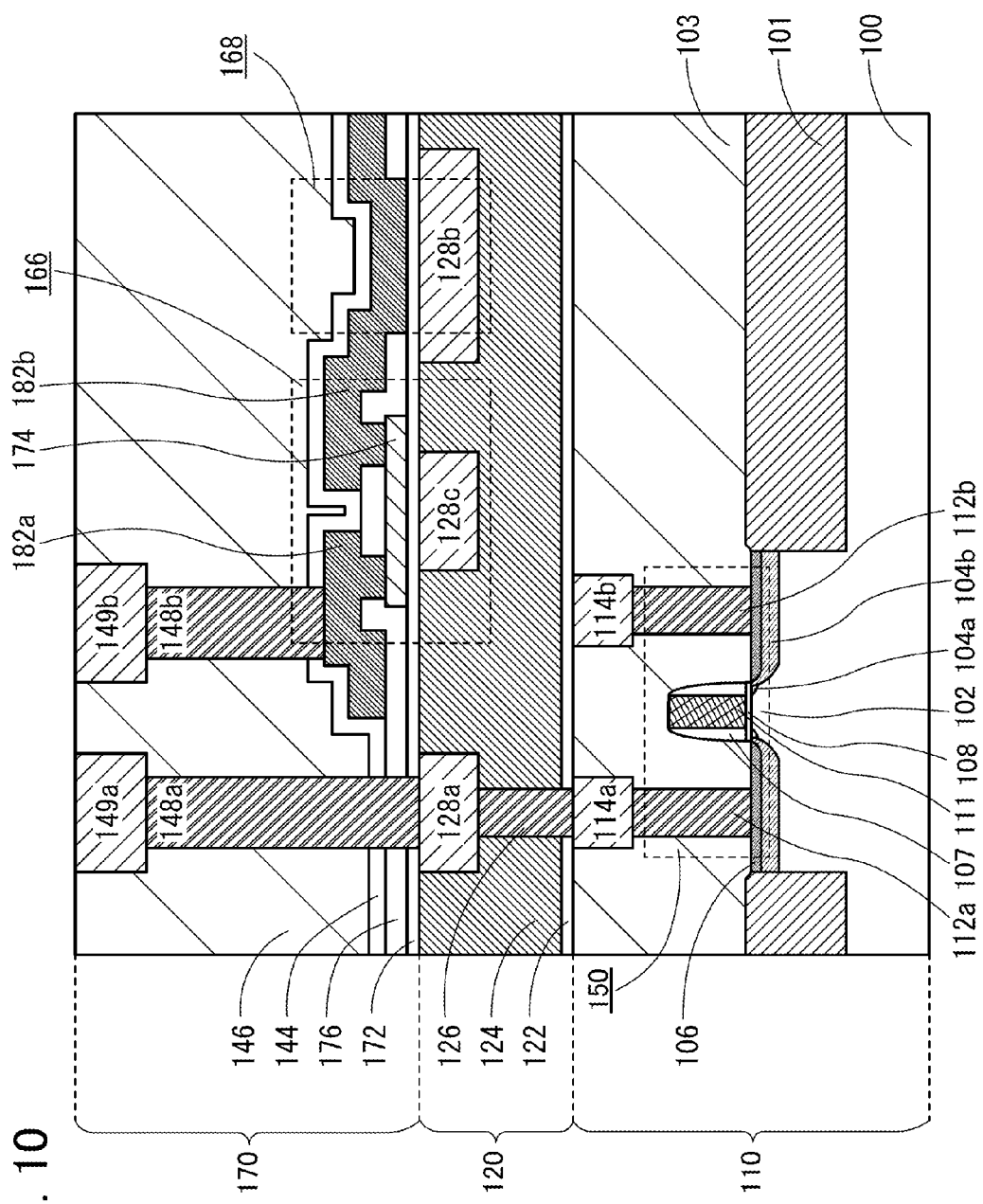

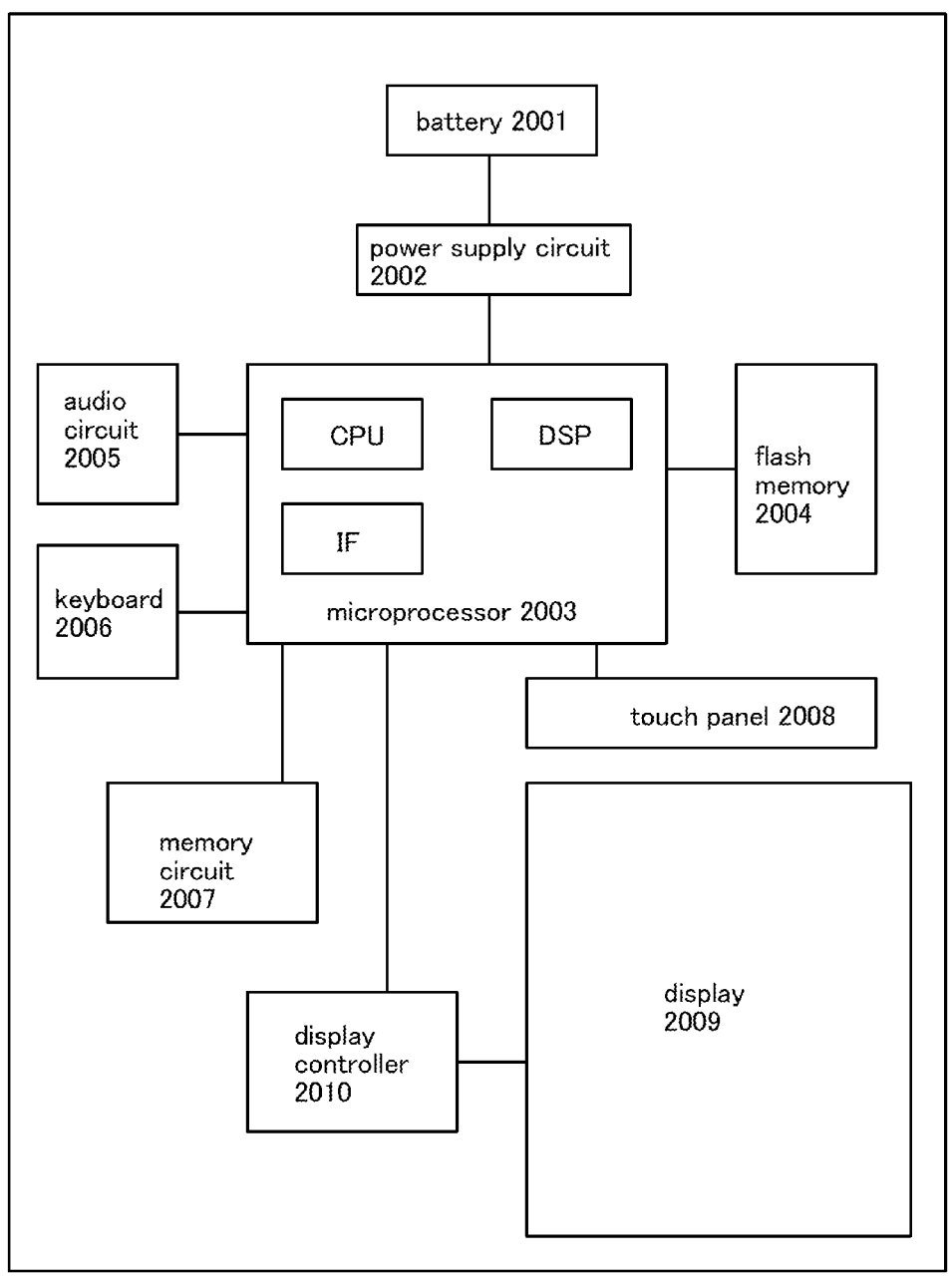

MULTI-LEVEL STACKED TRANSISTOR DEVICE INCLUDING CAPACITOR AND DIFFERENT SEMICONDUCTOR MATERIALS

BACKGROUND OF THE INVENTION

1. Field of the Invention

The technical field of the present invention relates to a semiconductor device. Here, semiconductor devices refer to general elements and devices which function utilizing semiconductor characteristics.

2. Description of the Related Art

Attention has been focused on a technique for forming a transistor using a semiconductor thin film formed over a substrate having an insulating surface. The transistor is applied to a wide range of electronic devices such as an integrated circuit (IC). A silicon-based semiconductor material is widely known as a material for a semiconductor thin film applicable to a transistor. As another material, an oxide semiconductor has been attracting attention.

For example, a transistor including a semiconductor thin film formed using an amorphous oxide containing indium (In), gallium (Ga), and zinc (Zn) (In—Ga—Zn—O-based amorphous oxide) is disclosed (see Patent Document 1).

REFERENCE

Patent Document

[Patent Document 1] Japanese Published Patent Application No. 2006-165529

SUMMARY OF THE INVENTION

High performance (for example, high-speed operation and low power consumption) of a semiconductor device such as an integrated circuit (IC) has been achieved through miniaturization and high integration of a semiconductor element formed using single crystal silicon or the like. However, power consumption of the semiconductor device due to current when a transistor is in an off state (referred to as off-state current or leakage current) increases as miniaturization and high integration of the semiconductor element progress; thus, the off-state current cannot now ignore.

Here, the above transistor including an oxide semiconductor with a wide band gap has a feature of an extremely small off-state current compared with a transistor including a semiconductor material which is not an oxide semiconductor, such as single crystal silicon. On the other hand, the operation speed of a transistor including an oxide semiconductor is not sufficiently high compared with that of a transistor including a semiconductor material which is not an oxide semiconductor, such as single crystal silicon.

Thus, an object of one embodiment of the disclosed invention is to provide a semiconductor device having a novel structure in which a transistor including an oxide semiconductor and a transistor including a semiconductor material which is not an oxide semiconductor are stacked. Another object is to provide a semiconductor device having a novel structure and lower power consumption.

Another object is to provide a semiconductor device in which a semiconductor element and a capacitor are formed efficiently.

One embodiment of the present invention is a semiconductor device in which a first semiconductor element layer including a transistor formed using a semiconductor material which is not an oxide semiconductor, such as silicon, and a second semiconductor element layer including a transistor formed using an oxide semiconductor are stacked. A capacitor is formed using a wiring layer, or a conductive film or an insulating film which is in the same layer as a conductive film or an insulating film of the second semiconductor element layer. For example, the following structures can be employed.

One embodiment of the disclosed invention is a semiconductor device including a first transistor which includes a semiconductor formed using a first semiconductor material, a wiring formed over the first transistor, a first insulating film formed over the wiring, a second transistor formed over the first transistor and the first insulating film, and a capacitor formed over the first transistor. The second transistor includes a film containing a second semiconductor material, which is formed over the first insulating film; a gate insulating film formed over the film containing the second semiconductor material; a gate electrode which is formed to overlap with the film containing the second semiconductor material with the gate insulating film provided therebetween; and a source electrode and a drain electrode each of which is in contact with part of a top surface of the film containing the second semiconductor material. The capacitor includes a first electrode, a second insulating film, and a second electrode. The wiring and the first electrode are formed using the same conductive film, the second insulating film and the gate insulating film are formed using the same insulating film, and the gate electrode and the second electrode are formed using the same conductive film.

In the above, the second electrode may be electrically connected to the source electrode or the drain electrode. Further, the first electrode may be electrically connected to the source electrode or the drain electrode. Furthermore, the capacitor may include the first electrode, the first insulating film, the second insulating film, and the second electrode.

Another embodiment of the disclosed invention is a semiconductor device including a first transistor which includes a semiconductor formed using a first semiconductor material, a wiring formed over the first transistor, a first insulating film formed over the wiring, a second transistor formed over the first transistor and the first insulating film, and a capacitor formed over the first transistor. The second transistor includes a film containing a second semiconductor material, which is formed over the first insulating film; a gate insulating film formed over the film containing the second semiconductor material; a gate electrode which is formed to overlap with the film containing the second semiconductor material with the gate insulating film provided therebetween; and a source electrode and a drain electrode each of which is in contact with part of a top surface of the film containing the second semiconductor material. The capacitor includes a first electrode, a second insulating film, and a second electrode. The wiring and the first electrode are formed using the same conductive film, the second insulating film and the first insulating film are formed using the same insulating film, and the source electrode, the drain electrode, and the second electrode are formed using the same conductive film.

In the above, the first insulating film may include a third insulating film containing silicon nitride and a fourth insulating film containing silicon oxide which is formed over the third insulating film. An opening may be formed in a region of the fourth insulating film, which overlaps with the first electrode.

In the above, the first insulating film may include the third insulating film containing silicon nitride and the fourth insulating film containing silicon oxide which is formed over the third insulating film. An opening may be formed in a region of the third insulating film and the fourth insulating film, which overlaps with the first electrode.

In the above, it is preferable that an interlayer insulating film be formed over the first transistor, that the wiring and the first electrode be embedded in the interlayer insulating film, and that exposed top surfaces of the wiring and the first electrode be substantially the same level with each other.

Another embodiment of the disclosed invention is a semiconductor device including a first transistor which includes a semiconductor formed using a first semiconductor material, a wiring formed over the first transistor, a second transistor formed over the first transistor, and a capacitor formed over the first transistor. The second transistor includes a gate electrode formed using the same conductive film as the wiring; a gate insulating film formed over the gate electrode; a film containing a second semiconductor material, which is formed over the gate insulating film to overlap with the gate electrode; and a source electrode and a drain electrode each of which is in contact with part of a top surface of the film containing the second semiconductor material. The capacitor includes a first electrode, a second insulating film, and a second electrode. The wiring and the first electrode are formed using the same conductive film, the first insulating film and the gate insulating film are formed using the same insulating film, and the source electrode, the drain electrode, and the second electrode are formed using the same conductive film.

In the above, it is preferable that an interlayer insulating film be formed over the first transistor, that the wiring, the gate electrode, and the first electrode be embedded in the interlayer insulating film, and that exposed top surfaces of the wiring, gate electrode, and the first electrode be substantially the same level with each other.

The first semiconductor material is preferably a silicon semiconductor. Further, the second semiconductor material is preferably an oxide semiconductor and further preferably, the second semiconductor material contains In, Ga, and Zn.

In this specification and the like, the expression "substantially the same" does not necessarily mean being exactly the same.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term such as "electrode" or "wiring" does not limit a function of a component. For example, an "electrode" is sometimes used as part of a "wiring", and vice versa. In addition, the term "electrode" or "wiring" can also mean a combination of a plurality of "electrodes" and "wirings", for example.

Functions of a "source" and a "drain" are sometimes replaced with each other when a transistor of opposite polarity is used or when the direction of current flowing is changed in circuit operation, for example. Thus, the terms "source" and "drain" can be replaced with each other in this specification.

Note that in this specification and the like, the term "electrically connected" includes the case where components are connected through an "object having any electric function". There is no particular limitation on an "object having any electric function" as long as electric signals can be transmitted and received between components that are connected through the object.

A semiconductor device having a novel structure in which a transistor including an oxide semiconductor and a transistor including a semiconductor material which is not an oxide semiconductor are stacked can be provided. Further, in the semiconductor device having a novel structure, power consumption can be reduced. Furthermore, in the semiconductor device having a novel structure, a semiconductor element can be highly integrated.

In addition, a semiconductor device in which a semiconductor element and a capacitor are formed efficiently can be provided.

BRIEF DESCRIPTION OF THE DRAWINGS

FIG. 10 is a cross-sectional view illustrating one embodiment of a semiconductor device.

FIG. 20 illustrates an example of a structure of a semiconductor device.

DETAILED DESCRIPTION OF THE INVENTION

Figure 1:
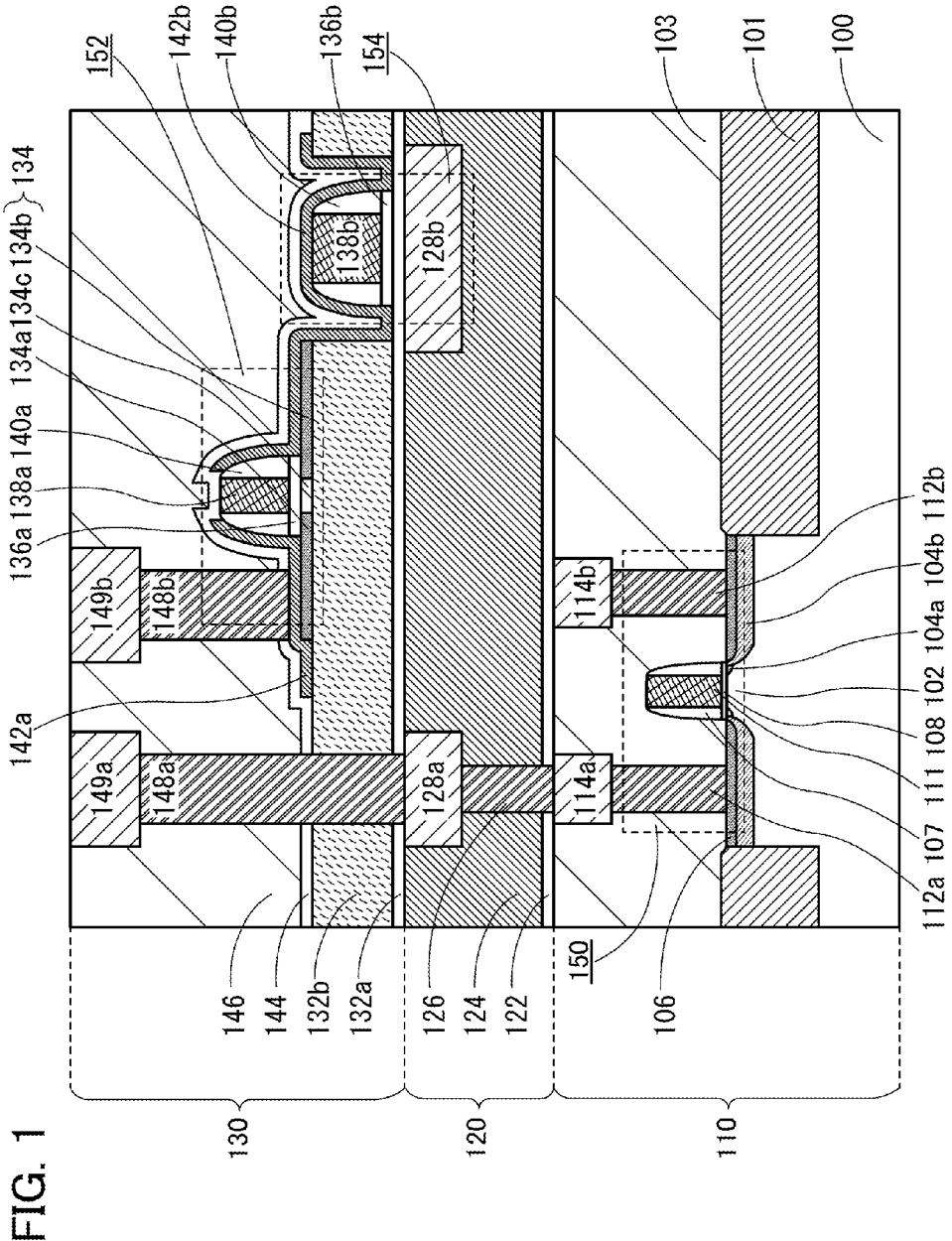
FIG. 1 is a cross-sectional view illustrating one embodiment of a semiconductor device.

Hereinafter, embodiments of the invention disclosed in this specification will be described with reference to the accompanying drawings. Note that the invention disclosed in this specification is not limited to the following description, and it is easily understood by those skilled in the art that modes and details can be variously changed without departing from the spirit and the scope of the invention. Thus, the invention disclosed in this specification is not construed as being limited to the description of the following embodiments.

Note that the position, size, range, and the like of each component illustrated in the drawings and the like are not accurately represented for easy understanding in some cases. Thus, the disclosed invention is not necessarily limited to the position, size, range, and the like in the drawings and the like.

In this specification and the like, ordinal numbers such as "first", "second", and "third" are used in order to avoid confusion among components, and the terms do not limit the components numerically.

Embodiment 1

In this embodiment, a semiconductor device of one embodiment of the present invention and a method for manufacturing the semiconductor device will be described with reference to FIG. 1, FIG. 2, FIG. 3, FIG. 4, FIG. 5, FIGS. 6A to 6D, FIGS. 7A to 7E, FIGS. 8A to 8D, and FIGS. 9A to 9C.

<Structural Example of Semiconductor Device>

FIG. 1 is a cross-sectional view illustrating an example of a structure of a semiconductor device. A semiconductor device illustrated in FIG. 1 includes a transistor 150 which includes a semiconductor formed using a first semiconductor material, a wiring 128a formed over the transistor 150, a transistor 152 formed over the transistor 150, and a capacitor 154 formed over the transistor 150. FIG. 1 illustrates a structure in which a first semiconductor element layer 110 including the transistor 150 formed using the first semiconductor material is provided in a lower portion, and the transistor 152 formed using a second semiconductor material and a second semiconductor element layer 130 including part of the capacitor 154 are provided in an upper portion. Further, the first semiconductor element layer 110 and the second semiconductor element layer 130 are electrically connected to each other through a wiring layer 120 provided therebetween. Although the semiconductor device illustrated in FIG. 1 includes one transistor 150, one transistor 152, and one capacitor 154, the semiconductor device may include a plurality of transistors 150, transistors 152, and capacitors 154.

Here, the first semiconductor material and the second semiconductor material are preferably materials having different band gaps. A semiconductor material which is not an oxide semiconductor is preferably used as the first semiconductor material, and an oxide semiconductor can be used as the second semiconductor material. As the semiconductor material which is not an oxide semiconductor, for example, silicon, germanium, silicon germanium, silicon carbide, gallium arsenide, or the like can be used and single crystal semiconductor is preferably used. A transistor including such a semiconductor material can easily operate at high speed. A transistor including an oxide semiconductor, on the other hand, has extremely small off-state current owing to its characteristics.

Note that either an n-channel transistor or a p-channel transistor can be used as the transistor 150 and the transistor 152. Here, the case where the transistor 152 is an n-channel transistor is described.

The transistor 150 provided in the first semiconductor element layer 110 includes a channel formation region 102 provided in a semiconductor substrate 100, impurity regions 104a and impurity regions 104b (also referred to as a source region or a drain region, in some cases) which are provided in the semiconductor substrate 100 so that the channel formation region 102 is provided therebetween, intermetallic compound regions 106 in contact with the impurity regions 104a and the impurity regions 104b, a gate insulating film 108 provided over the channel formation region 102, and a gate electrode 111 which is provided over the gate insulating film 108 to overlap with the channel formation region 102. Note that the impurity concentration of the impurity regions 104a is lower than that of the impurity regions 104b.

Note that one of sets each including the impurity region 104a, the impurity region 104b, and the intermetallic compound region 106, between which the gate electrode 111 is provided, can function as a source region (or a drain region) of the transistor 150. The other of the sets each including the impurity region 104a, the impurity region 104b, and the intermetallic compound region 106, between which the gate electrode 111 is provided, can function as a drain region (or a source region) of the transistor 150. Accordingly, the impurity region 104a, the impurity region 104b, and the intermetallic compound region 106 are collectively referred to as a source region or a drain region, in some cases. Further, in description of a connection of a transistor, a source region and a source electrode are collectively referred to as a "source electrode," and a drain region and a drain electrode are collectively referred to as a "drain electrode". That is, in this specification, the term "source electrode" might include a source region and the term "drain electrode" might include a drain region.

Here, a sidewall insulating film 107 is provided on side surfaces of the gate electrode 111. The impurity regions 104a are provided to overlap with the sidewall insulating film 107, whereas the impurity regions 104b are provided not to overlap with the sidewall insulating film 107. As described above, the sidewall insulating film 107 is provided and the impurity regions 104a and the impurity regions 104b having different impurity concentrations are provided, whereby transistor characteristics of the transistor 150 can be improved. Note that the transistor 150 may have a structure in which the sidewall insulating film 107 is not included.

Further, a connection electrode 112a is provided on and in contact with one of the intermetallic compound regions 106 and a connection electrode 112b is provided on and in contact with the other of the intermetallic compound regions 106. Here, the connection electrode 112a and the connection electrode 112b also function as a source electrode and a drain electrode of the transistor 150. Furthermore, a wiring 114a is provided on and in contact with the connection electrode 112a and a wiring 114b is provided on and in contact with the connection electrode 112b.

In addition, an element isolation insulating layer 101 is provided over the semiconductor substrate 100 so as to surround the transistor 150. Further, an interlayer insulating film 103 is provided over the transistor 150 so that the top surfaces of the wiring 114a and the wiring 114b are exposed. Although the interlayer insulating film 103 is a single layer here, the interlayer insulating film 103 is not necessarily a single layer and may have a stacked-layer structure of two or more layers. For example, the interlayer insulating film 103 can have a structure in which an interlayer insulating film with the same thickness as the connection electrode 112a and the connection electrode 112b, and an interlayer insulating film with the same thickness as the wiring 114a and the wiring 114b are stacked.

The wiring layer 120 formed over the first semiconductor element layer 110 includes an interlayer insulating film 122 formed over the interlayer insulating film 103, the wiring 114a, and the wiring 114b; an interlayer insulating film 124 formed over the interlayer insulating film 122; a connection electrode 126 formed so as to penetrate the interlayer insulating film 122 and to be embedded in the interlayer insulating film 124; and the wiring 128a and an electrode 128b which are formed so as to be embedded in the interlayer insulating film 124. The wiring 128a and the electrode 128b are provided so that the top surfaces are not covered with the interlayer insulating film 124, and are formed using the same conductive film. Note that in this specification and the like, the term "same layer" means a layer formed using the same material in the same process and thus does not always mean that the thickness of the layer or the height of the layer in a cross-sectional view is the same.

Here, the top surfaces of the interlayer insulating film 124, the wiring 128a, and the electrode 128b are preferably in substantially the same plane.

Further, the connection electrode 126 is provided in contact with the top surface of the wiring 114a, and the wiring 128a is provided in contact with the top surface of the connection electrode 126. In other words, the wiring 128a is electrically connected to the transistor 150 through the connection electrode 126. Note that the structure of the disclosed invention is not limited to that illustrated in FIG. 1. The connection electrode 126 and the wiring 128a can be connected to the gate electrode, the source electrode, or the drain electrode of the transistor 150 as appropriate, depending on a circuit configuration of the semiconductor device.

Although the wiring layer 120 has a stacked-layer structure of the interlayer insulating film 122 and the interlayer insulating film 124 here, the wiring layer 120 does not necessarily have such a stacked-layer structure and may have a single-layer structure or a stacked-layer structure of three or more layers. For example, a structure in which an interlayer insulating film having the same thickness as the connection electrode 126 and an interlayer insulating film having the same thickness as the wiring 128a and the electrode 128b are stacked over the interlayer insulating film 122 may be employed.

The second semiconductor element layer 130 formed over the wiring layer 120 includes a base insulating film 132a formed over the interlayer insulating film 124, the wiring 128a, and the electrode 128b; a base insulating film 132b formed over the base insulating film 132a; the transistor 152 formed over the base insulating film 132b; a protective insulating film 144 formed over the base insulating film 132b and the transistor 152; an interlayer insulating film 146 formed over the protective insulating film 144; a connection electrode 148a formed so as to penetrate the base insulating film 132a, the base insulating film 132b, and the protective insulating film 144 and to be embedded in the interlayer insulating film 146; a connection electrode 148b formed so as to penetrate the protective insulating film and to be embedded in the interlayer insulating film 146; and a wiring 149a and a wiring 149b formed so as to be embedded in the interlayer insulating film 146. The wiring 149a and the wiring 149b are provided so that the top surfaces thereof are not covered with the interlayer insulating film 146 and are formed using the same conductive film.

Further, the connection electrode 148a is provided in contact with the top surface of the wiring 128a, and the wiring 149a is provided in contact with the top surface of the connection electrode 148a. In other words, the wiring 149a is electrically connected to the transistor 150 through the connection electrode 148a.

The transistor 152 provided in the second semiconductor element layer 130 includes an oxide semiconductor film 134 formed over the base insulating film 132b; a gate insulating film 136a formed over the oxide semiconductor film 134; a gate electrode 138a formed to overlap with the oxide semiconductor film 134 with the gate insulating film 136a provided therebetween; a sidewall insulating film 140a formed in contact with at least a side surface of the gate electrode 138a; and a source electrode (or a drain electrode) 142a and a drain electrode (or a source electrode) 142b each of which is formed at least in contact with part of the top surface of the oxide semiconductor film 134. The connection electrode 148b is provided in contact with the top surface of the source electrode 142a, and the wiring 149b is provided in contact with the top surface of the connection electrode 148b. Further, the protective insulating film 144 is provided so as to cover the transistor 152. Note that the sidewall insulating film 140a is not necessarily provided in the transistor 152.

As illustrated in FIG. 1, the oxide semiconductor film 134 includes a channel formation region 134c which overlaps with the gate electrode 138a, and an impurity region 134a and an impurity region 134b having lower resistivity than the channel formation region 134c, between which the channel formation region 134c is provided. The source electrode 142a is in contact with the impurity region 134a in the oxide semiconductor film 134 and the drain electrode 142b is in contact with the impurity region 134b in the oxide semiconductor film 134. Here, the impurity region 134a and the impurity region 134b can also function as a source region and a drain region of the transistor 152. The impurity region 134a and the impurity region 134b can be formed in a self-aligned manner by introduction of impurity elements with the use of the gate electrode 138a as a mask after the gate electrode 138a is formed, for example.

An oxide semiconductor used for the oxide semiconductor film 134 preferably contains at least indium (In), zinc (Zn), or tin (Sn). In particular, In and zinc (Zn) are preferably contained. In addition, as a stabilizer for reducing variations in electric characteristics of a transistor including the oxide semiconductor, gallium (Ga) is preferably contained in addition to In and Zn. Tin (Sn) is preferably contained as a stabilizer. Hafnium (Hf) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide, an In—Zn-based oxide, an In—Mg-based oxide, or an In—Ga-based oxide, an In—Ga—Zn-based oxide (also referred to as IGZO), an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, an In—Sn—Ga—Zn-based oxide, an In—Hf—Ga—Zn-based oxide, and an In—Sn—Hf—Zn-based oxide.

Note that here, for example, an "In—Ga—Zn-based oxide" means an oxide containing In, Ga, and Zn as its main components and there is no limitation on the ratio of In:Ga:Zn. The In—Ga—Zn-based oxide may contain a metal element other than the In, Ga, and Zn.

Alternatively, a material represented by $InMO_3(ZnO)_m$ (m>0, where m is not an integer) may be used as the oxide semiconductor. Note that M represents one or more metal elements selected from Ga, Fe, Mn, and Co.

In the case where an oxide containing In and Ga at a composition of In≤Ga is used for the oxide semiconductor film 134, an oxide semiconductor film having stable characteristics can be obtained. This is because in Ga, the formation energy of oxygen vacancy is larger and thus oxygen vacancy is less likely to occur, than in In; thus, the oxide having a composition of In≤Ga has more stable characteristics than an oxide having a composition of In>Ga. As such an oxide, for example, an In—Ga—Zn-based oxide with an atomic ratio where In:Ga:Zn=1:1:1 or In:Ga:Zn=1:3:2, or an oxide having a composition in the neighborhood of the above composition can be used.

In the case where an oxide containing In and Ga at a composition of In>Ga is used for the oxide semiconductor film 134, an oxide semiconductor film having high mobility can be obtained. This is because in an oxide semiconductor, the s orbital of heavy metal mainly contributes to carrier transfer, and when the In content in the oxide semiconductor is increased, overlaps of the s orbitals are likely to be increased and as a result, an oxide having a composition of In>Ga has higher mobility than an oxide having a composition of In≤Ga. As such an oxide, for example, an In—Ga—Zn-based oxide with an atomic ratio where In:Ga:Zn=3:1:2 or In:Ga:Zn=2:1:3, or an oxide having a composition in the neighborhood of the above composition can be used.

Alternatively, the oxide semiconductor film 134 may have a stacked-layer structure of a plurality of oxide semiconductor films. For example, a structure in which an oxide semiconductor film formed using the oxide containing In and Ga at a composition of In>Ga is stacked over an oxide semiconductor film formed using the oxide containing In and Ga at a composition of In≤Ga may be employed. In such a manner, an oxide semiconductor film having stable characteristics is used on a back channel side which is not in contact with the gate insulating film 136a and an oxide semiconductor film having high mobility is used on a side which is in contact with the gate insulating film 136a, whereby the transistor 152 can have both high mobility and high reliability.

Note that the composition of the oxide semiconductor is not limited to those described above, and a material having an appropriate composition may be used in accordance with necessary semiconductor characteristics (such as mobility, threshold voltage, and variation). To obtain necessary semiconductor characteristics, it is preferable that the carrier concentration, the impurity concentration, the defect density, the atomic ratio of a metal element to oxygen, the interatomic distance, the density, and the like be set as appropriate.

The oxide semiconductor film 134 is preferably highly purified by sufficient removal of impurities such as hydrogen and by supersaturation with oxygen by sufficient supply of oxygen. Specifically, the hydrogen concentration in the oxide semiconductor film 134 is lower than or equal to $5\times10^{19}$ atoms/cm³, preferably lower than or equal to $5\times10^{18}$ atoms/cm³, further preferably lower than or equal to $5\times10^{17}$ atoms/cm³. Note that the hydrogen concentration in the oxide semiconductor film 134 is measured by secondary ion mass spectrometry (SIMS). When such an oxide semiconductor film 134 in which the hydrogen concentration is sufficiently reduced for high purification and defect levels in an energy gap due to oxygen deficiency are reduced by sufficient supply of oxygen is used for the transistor 152, off-state current (per unit channel width (1 μm) here) at room temperature (25° C.) is smaller than or equal to 100 zA (1 zA (zeptoampere) is $1\times10^{-21}$ A), desirably smaller than or equal to 10 zA, for example. With the use of such an oxide semiconductor film 134 which is made to be an i-type (intrinsic) oxide semiconductor or a substantially i-type oxide semiconductor, the transistor 152 which has extremely favorable off-state current characteristics can be obtained.

Further, the oxide semiconductor film 134 is preferably in a supersaturated state in which the oxygen content is in excess of that of that in the stoichiometric composition. Here, for sufficient supply of oxygen to make the film in a supersaturated state, an insulating film containing excess oxygen is preferably provided so as to surround and be in contact with the oxide semiconductor film 134. In addition, an insulating film functioning as a barrier film is preferably provided so as to surround the insulating film containing excess oxygen to prevent impurities such as hydrogen from entering the oxide semiconductor film 134. Thus, the base insulating film 132a which functions as a barrier film, the base insulating film 132b containing excess oxygen, the gate insulating film 136a containing excess oxygen, and the protective insulating film 144 which functions as a barrier film are used in this embodiment.

The oxide semiconductor film 134 is in a single crystal state, a polycrystalline (also referred to as polycrystal) state, an amorphous state, or the like.

In this embodiment, the channel formation region 134c in the oxide semiconductor film 134 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light is small. Thus, the transistor has high reliability.

Note that part of oxygen included in the oxide semiconductor film may be substituted with nitrogen.

In an oxide semiconductor having a crystal part such as the CAAC-OS, defects in the bulk can be further reduced and when the surface flatness of the oxide semiconductor is improved, mobility higher than that of an oxide semiconductor in an amorphous state can be obtained. To improve the surface flatness, the oxide semiconductor is preferably formed over a flat surface. Specifically, the average surface roughness ($R_a$) of the base insulating film 132b over which the oxide semiconductor film 134 is formed is preferably less than or equal to 1 nm, further preferably less than or equal to 0.3 nm, still further preferably less than or equal to 0.1 nm.

Note that $R_a$ is obtained by expanding arithmetic mean surface roughness, which is defined by JIS B0601, into three dimensions so as to be applied to a surface. $R_a$ can be expressed as an "average value of the absolute values of deviations from a reference surface to a specific surface" and is defined by the following formula.

[Formula 1]

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. Further, $S_0$ represents the area of a rectangle which is obtained by projecting the specific surface on the x-y plane, and $Z_0$ represents the height of the reference surface (the average height of the specific surface). Note that $R_a$ can be measured using an atomic force microscope (AFM).

Alternatively, in the case where the oxide semiconductor film 134 has a stacked-layer structure of a plurality of oxide semiconductor films, a structure in which oxide semiconductor films having different crystallinities are stacked may be employed. That is, the oxide semiconductor film 134 may have a structure in which a single crystal oxide semiconductor film, a polycrystalline oxide semiconductor film, a nanocrystalline oxide semiconductor film, an amorphous oxide semiconductor film, and a CAAC-OS film are stacked in appropriate combination. In the case where the oxide semiconductor film 134 has a stacked-layer structure of two oxide semiconductor films, for example, internal stress or external stress of the oxide semiconductor film 134 can be relieved, variation in characteristics of a transistor can be reduced, and reliability of the transistor can be further improved when an amorphous oxide semiconductor film is used for at least one of the oxide semiconductor films. On the other hand, in an amorphous oxide semiconductor, an impurity which serves as a donor, such as hydrogen is easily absorbed and oxygen vacancy easily occurs, so that the amorphous oxide semiconductor is likely to be n-type. Thus, the oxide semiconductor film provided on the channel side is preferably formed using a crystalline oxide semiconductor film such as a CAAC-OS film.

The oxide semiconductor film 134 may have a stacked-layer structure of three or more layers in which an amorphous oxide semiconductor film is provided between a plurality of oxide semiconductor films having crystallinity. A structure in which an oxide semiconductor film having crystallinity and an amorphous oxide semiconductor film are alternately stacked may also be employed.

Note that the oxide semiconductor film 134 may be amorphous or may have crystallinity. For the oxide semiconductor film having crystallinity, a crystalline oxide semiconductor having c-axis alignment (also referred to as a c-axis aligned crystalline oxide semiconductor (CAAC-OS)) is preferably used because the reliability of the transistor can be improved.

Specifically, the CAAC-OS is a non-single-crystal semiconductor that has a triangular, hexagonal, equilateral triangular, or regular hexagonal atomic arrangement when seen from a direction perpendicular to an a-b plane. The CAAC-OS also has a phase in which metal atoms are arranged in a layered manner in the c-axis direction or a phase in which metal atoms and oxygen atoms are arranged in a layered manner in the c-axis direction.

In addition, the capacitor 154 is formed using films in the second semiconductor element layer 130 and the wiring layer 120. The capacitor 154 includes the electrode 128b, the base insulating film 132a, an insulating film 136b, and an electrode 138b. The insulating film 136b and the gate insulating film 136a are formed using the same insulating film, and the electrode 138b and the gate electrode 138a are formed using the same conductive film. That is, the electrode 128b functions as one electrode of the capacitor 154, the electrode 138b functions as the other electrode of the capacitor 154, and the insulating film 136b and the base insulating film 132a each function as a dielectric of the capacitor 154. Here, an opening is formed in a region of the base insulating film 132b which overlaps with the electrode 128b. The insulating film 136b and the electrode 138b are formed to overlap with the electrode 128b and the base insulating film 132a in the opening. Further, a sidewall insulating film 140b is provided in contact with at least side surfaces of the electrode 138b as similar to the case of the gate electrode 138a.

Furthermore, as illustrated in FIG. 1, the drain electrode 142b of the transistor 152 may be in contact with the top surface of the electrode 138b. Note that the structure of the disclosed invention is not limited to that illustrated in FIG. 1, and a semiconductor element, a capacitor, a wiring, and the like included in the first semiconductor element layer 110, the wiring layer 120, and the second semiconductor element layer 130 can be connected as appropriate, depending on a configuration of a semiconductor circuit.

Here, the electrode 128b, the insulating film 136b, and the electrode 138b included in the capacitor 154 are formed using the same layer and the same material in the same process as the wiring 128a, the gate insulating film 136a, and the gate electrode 138a, respectively. According to this, the capacitor 154 can be formed without unnecessary steps in the process of forming the wiring layer 120 and the transistor 152 in the second semiconductor element layer 130, so that the semiconductor element and the capacitor can be efficiently formed.

In such a manner, the second semiconductor element layer including an oxide semiconductor is provided over the first semiconductor element layer including a semiconductor material which is not an oxide semiconductor, such as single crystal silicon; thus, a semiconductor device having a novel structure in which a transistor including single crystal silicon or the like and a transistor including an oxide semiconductor are included in one integrated circuit can be provided.

Accordingly, a transistor including single crystal silicon or the like which can easily operate at high speed and a transistor including an oxide semiconductor which has an extremely low off-state current can be used as appropriate according to functions of the transistors in an integrated circuit. Thus, when a transistor whose leakage current is large in a conventional integrated circuit including single crystal silicon is replaced with a transistor including an oxide semiconductor, for example, power consumption can be reduced. Since a transistor including single crystal silicon is also used at this time, high-speed operation of the integrated circuit can be maintained.

Further, since the second semiconductor element layer including an oxide semiconductor is stacked over the first semiconductor element layer including a semiconductor material which is not an oxide semiconductor, such as single crystal silicon, an increase in area occupied by the transistor including an oxide semiconductor material can be prevented. Thus, the semiconductor element having a novel structure can be highly integrated.

Figure 2:
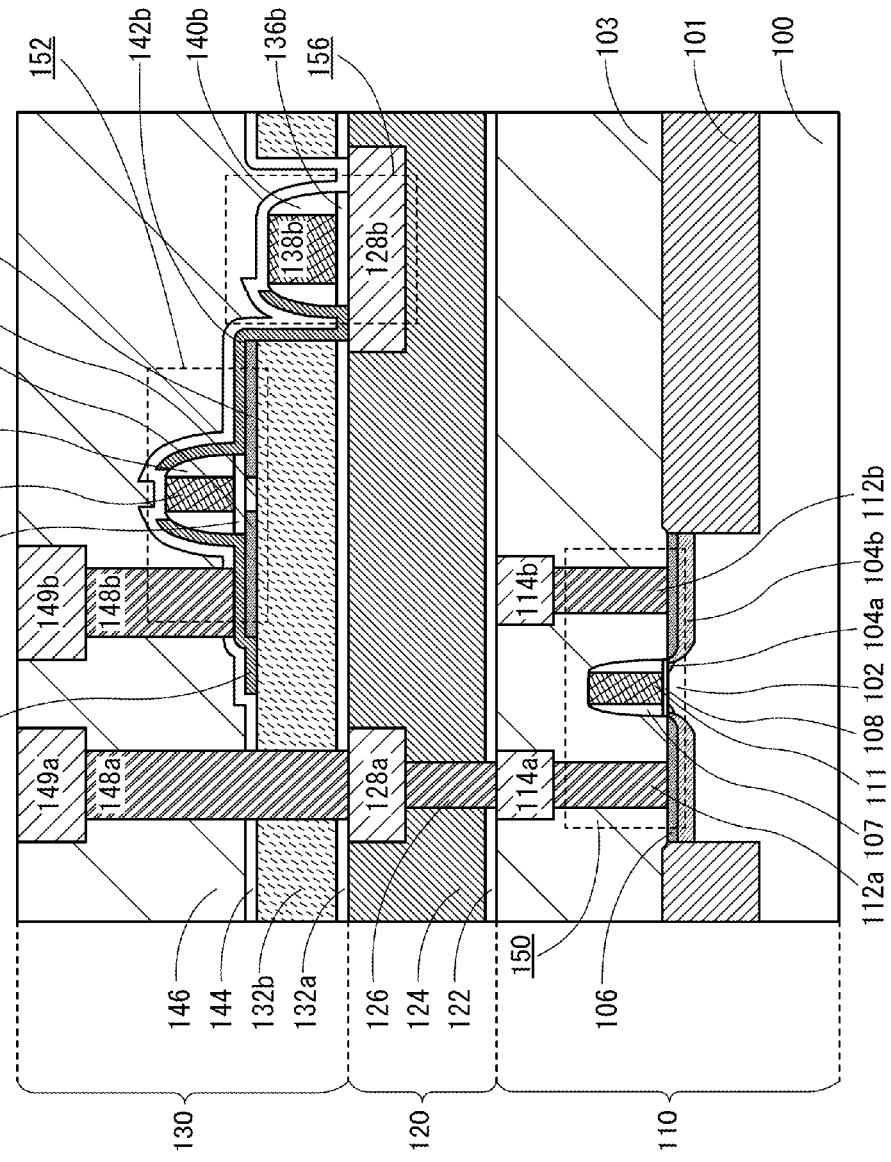
FIG. 2 is a cross-sectional view illustrating one embodiment of a semiconductor device.

FIG. 2 illustrates a semiconductor device having a structure different from that in FIG. 1. In the semiconductor device illustrated in FIG. 2, a structure of a capacitor 156 in the second semiconductor element layer 130 is different from the structure of the capacitor 154 in the second semiconductor element layer 130 in the semiconductor device illustrated in FIG. 1. Specifically, an opening is formed in the base insulating film 132a in the capacitor 156 and the insulating film 136b is the only insulating film functioning as a dielectric of the capacitor. In addition, the drain electrode 142b of the transistor 152 is not connected to the electrode 138b, but to the electrode 128b. As described above, the insulating film 136b is the only insulating film functioning as a dielectric of the capacitor, so that the thickness of the insulating film functioning as a dielectric can be thinner than that of the capacitor 154 illustrated in FIG. 1; thus, the electric capacity of the capacitor can be further increased. Note that structures of other parts are similar to those of the semiconductor device illustrated in FIG. 1; thus, the above description can be referred to for the details.

Figure 3:
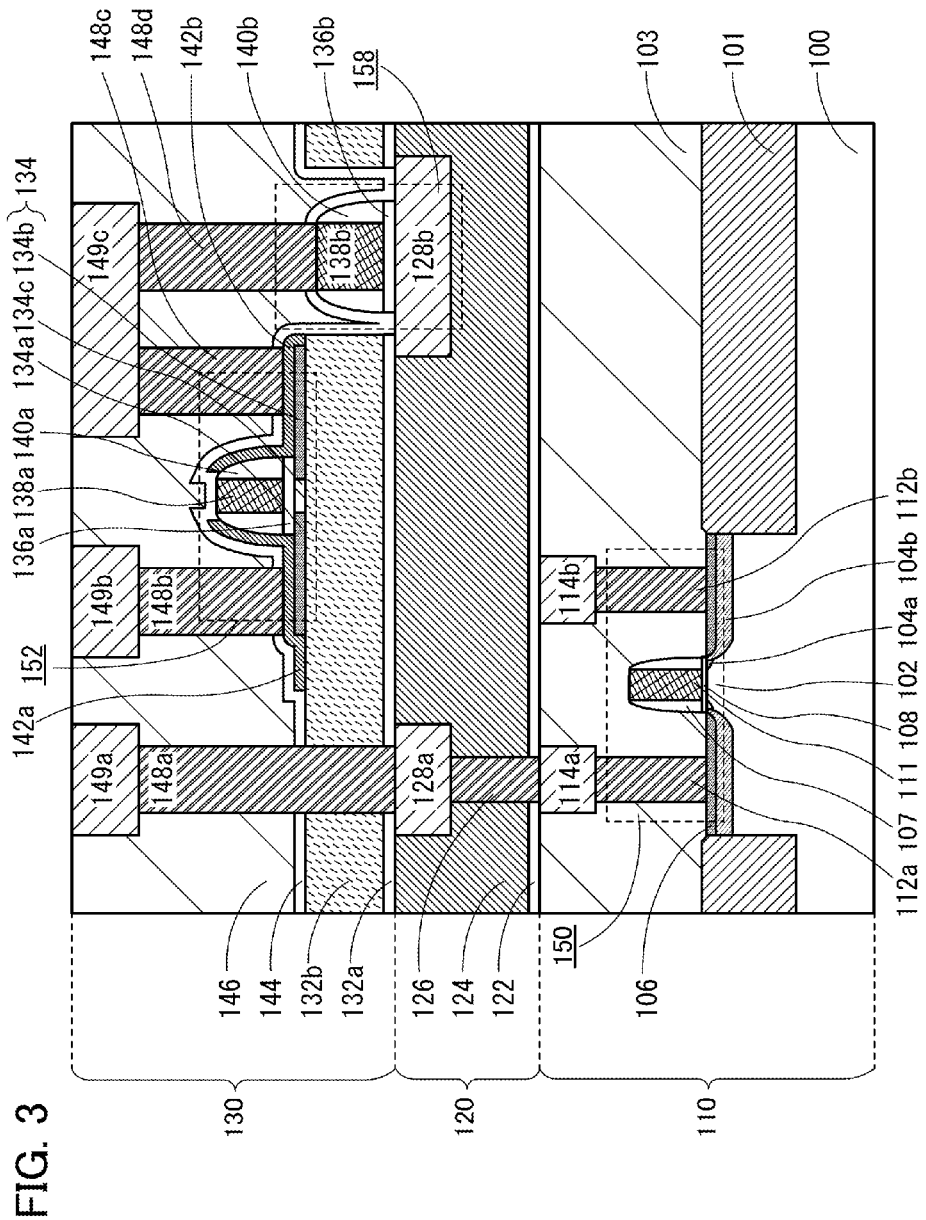
FIG. 3 is a cross-sectional view illustrating one embodiment of a semiconductor device.

FIG. 3 illustrates a semiconductor device having a structure different from that in FIG. 1. In the semiconductor device illustrated in FIG. 3, a structure of a capacitor 158 in the second semiconductor element layer 130 is different from the structure of the capacitor 154 in the second semiconductor element layer 130 of the semiconductor device illustrated in FIG. 1. Specifically, an opening is formed in the base insulating film 132a in the capacitor 158 and the insulating film 136b is the only insulating film functioning as a dielectric of the capacitor. In addition, the drain electrode 142b of the transistor 152 and the electrode 138b of the capacitor 158 are connected to each other through a connection electrode 148c, a connection electrode 149c, and a connection electrode 148d provided in the interlayer insulating film 146. As described above, the insulating film 136b is the only insulating film functioning as a dielectric of the capacitor, so that the thickness of the insulating film functioning as a dielectric can be thinner than that of the capacitor 154 illustrated in FIG. 1; thus, the electric capacity of the capacitor can be further increased. Note that structures of other parts are similar to those of the semiconductor device illustrated in FIG. 1; thus, the above description can be referred to for the details.

Figure 4:
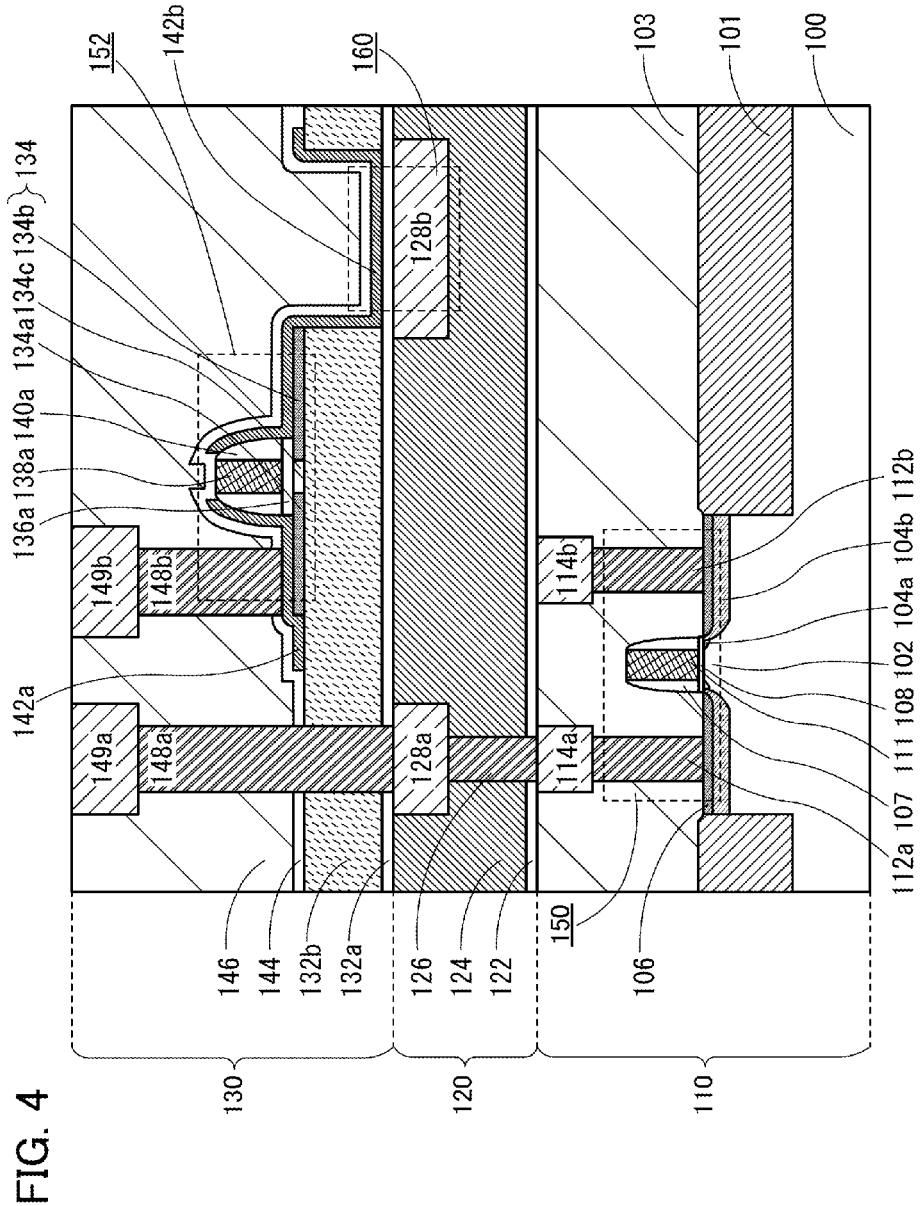
FIG. 4 is a cross-sectional view illustrating one embodiment of a semiconductor device.

FIG. 4 illustrates a semiconductor device having a structure different from that in FIG. 1. In the semiconductor device illustrated in FIG. 4, a structure of a capacitor 160 in the second semiconductor element layer 130 is different from the structure of the capacitor 154 in the second semiconductor element layer 130 of the semiconductor device illustrated in FIG. 1. Specifically, the capacitor 160 includes the drain electrode 142b, the base insulating film 132a, and the electrode 128b, and the conductive film which is formed at the same time as the gate electrode 138a and the insulating film which is formed at the same time as the gate insulating film 136a are not used. As described above, the base insulating film 132a is the only insulating film functioning as a dielectric of the capacitor, so that the thickness of the insulating film functioning as a dielectric can be thinner than that of the capacitor 154 illustrated in FIG. 1; thus, the electric capacity of the capacitor can be further increased. Note that structures of other parts are similar to those of the semiconductor device illustrated in FIG. 1; thus, the above description can be referred to for the details.

Figure 5:
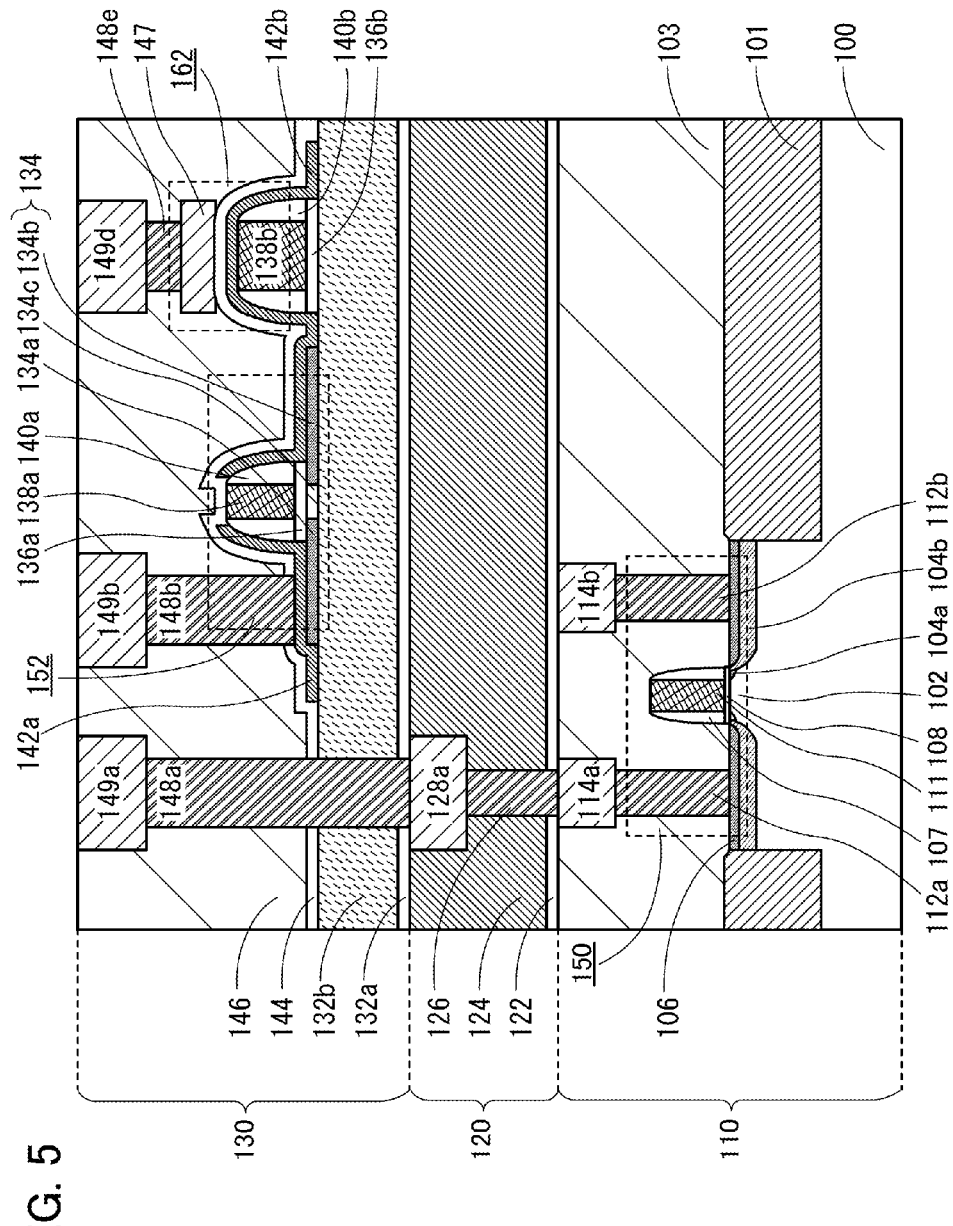
FIG. 5 is a cross-sectional view illustrating one embodiment of a semiconductor device.

FIG. 5 illustrates a semiconductor device having a structure different from that in FIG. 1. In the semiconductor device illustrated in FIG. 5, a structure of a capacitor 162 in the second semiconductor element layer 130 is different from the structure of the capacitor 154 in the second semiconductor element layer 130 of the semiconductor device illustrated in FIG. 1. Specifically, the capacitor 162 includes the electrode 138b, the drain electrode 142b, the protective insulating film 144, and an electrode 147, and a conductive film which is formed at the same time as the wiring 128a is not used. In addition, the electrode 147 is connected to a wiring 149d through a connection electrode 148e embedded in the interlayer insulating film 146. As described above, the protective insulating film 144 is the only insulating film functioning as a dielectric of the capacitor, so that the thickness of the insulating film functioning as a dielectric can be thinner than that of the capacitor 154 illustrated in FIG. 1; thus, the electric capacity of the capacitor can be further increased. Note that structures of other parts are similar to those of the semiconductor device illustrated in FIG. 1; thus, the above description can be referred to for the details.

Note that the structures of the semiconductor devices illustrated in FIGS. 1 to 5 are not limited to the structures illustrated in the drawings, and a semiconductor element, a capacitor, a wiring, and the like included in the first semiconductor element layer 110, the wiring layer 120, and the second semiconductor element layer 130 can be connected as appropriate, depending on a configuration of a semiconductor circuit. Further, an electrode, a wiring, a semiconductor layer, an insulating layer, and the like may be additionally formed so that a semiconductor element layer or a wiring layer is added. For example, a multilayer wiring structure in which an insulating layer and a conductive layer are stacked is employed as a wiring structure, so that a highly-integrated semiconductor device can be provided.

<Method for Manufacturing Semiconductor Device>

A method for manufacturing the semiconductor device illustrated in FIG. 1 will be described below with reference to FIGS. 6A to 6D, FIGS. 7A to 7E, FIGS. 8A to 8D, and FIGS. 9A to 9C.

<Method for Forming First Semiconductor Element Layer>

First, a method for forming the first semiconductor element layer 110 will be described with reference to FIGS. 6A to 6D.

First, the semiconductor substrate 100 is prepared. A single crystal semiconductor substrate or a polycrystalline semiconductor substrate of silicon, silicon carbide, or the like; a compound semiconductor substrate of silicon germanium or the like; an SOI substrate; or the like can be used as the semiconductor substrate 100. Here, an example in which a single crystal silicon substrate is used as the semiconductor substrate 100 is described. Note that although the term "SOI substrate" generally means a substrate in which a silicon semiconductor layer is provided on an insulating surface, the term "SOI substrate" in this specification and the like also means a substrate in which a semiconductor layer including a material other than silicon is provided on an insulating surface. That is, a semiconductor layer included in the "SOI substrate" is not limited to a silicon semiconductor layer. Further, the SOI substrate can be a substrate having a structure in which a semiconductor layer is provided over an insulating substrate such as a glass substrate with an insulating layer provided therebetween.

It is particularly preferable that a single crystal semiconductor substrate of silicon or the like be used as the semiconductor substrate 100 because the transistor 150 can operate at higher speed.

Then, a protective layer serving as a mask for forming the element isolation insulating layer is formed over the semiconductor substrate 100. As the protective layer, for example, an insulating layer formed using a material such as silicon oxide, silicon nitride, or silicon oxynitride, can be used. Note that before or after this step, an impurity element imparting n-type conductivity or an impurity element imparting p-type conductivity may be added to the semiconductor substrate 100 to control the threshold voltage of the transistor. When silicon is used as the semiconductor, phosphorus, arsenic, or the like can be used as the impurity imparting n-type conductivity, for example. On the other hand, boron, aluminum, gallium, or the like can be used as the impurity imparting p-type conductivity, for example.

Next, part of the semiconductor substrate 100 in a region that is not covered with the protective layer (i.e., an exposed region) is removed by etching using the protective layer as a mask. Accordingly, a semiconductor region 105 separated from other semiconductor regions is formed. As the etching, dry etching is preferably performed, but wet etching may be performed. An etching gas and an etchant can be selected as appropriate depending on a material to be etched.

Then, an insulating layer is formed so as to cover the semiconductor region 105, and the insulating layer in a region overlapping with the semiconductor region 105 is selectively removed, so that the element isolation insulating layer 101 is formed. The insulating layer is formed using silicon oxide, silicon nitride, silicon oxynitride, or the like. As a method for removing the insulating layer, any of polishing treatment such as chemical mechanical polishing (CMP), etching treatment, and the like can be used. Note that the protective layer is removed after the semiconductor region 105 is formed or after the element isolation insulating layer 101 is formed.

Next, an insulating film 108a is formed on the top surface of the semiconductor region 105. The insulating film 108a is to be the gate insulating film 108 later and can be formed by heat treatment (thermal oxidation treatment, thermal nitridation treatment, or the like) of the surface of the semiconductor region 105, for example. High-density plasma treatment may be employed instead of heat treatment. The high-density plasma treatment can be performed using, for example, a mixed gas of any of a rare gas such as He, Ar, Kr, or Xe; oxygen; nitrogen oxide; ammonia; nitrogen; hydrogen; and the like. Needless to say, the insulating film 108a may be formed using a CVD method, a sputtering method, or the like. The insulating film 108a preferably has a single-layer structure or a stacked structure including a film of any of silicon oxide, silicon oxynitride, silicon nitride, hafnium oxide, aluminum oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, and the like. Further, the thickness of the insulating film 108a can be, for example, greater than or equal to 1 nm and less than or equal to 100 nm, preferably greater than or equal to 10 nm and less than or equal to 50 nm.

Figure 6A:
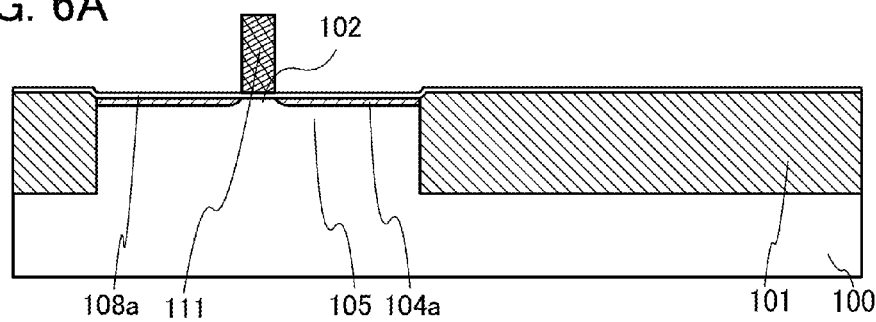
FIGS. 6A to 6D are cross-sectional views illustrating one embodiment of a method for manufacturing a semiconductor device.

Then, a layer containing a conductive material is formed over the insulating film 108a and is selectively etched to form the gate electrode 111 (see FIG. 6A).

The layer containing a conductive material can be formed using a metal material such as aluminum, copper, titanium, tantalum, or tungsten. The layer containing a conductive material may be formed using a semiconductor material such as polycrystalline silicon. There is no particular limitation on the method for forming the layer containing a conductive material, and any of a variety of deposition methods such as an evaporation method, a CVD method, a sputtering method, and a spin coating method can be used. Note that in this embodiment, an example in which the layer containing a conductive material is formed using a metal material is described.

As the etching, dry etching is preferably performed, but wet etching may be performed. An etching gas and an etchant can be selected as appropriate depending on a material to be etched.

Then, the impurity regions 104a with a shallow junction depth are formed by adding phosphorus (P), arsenic (As), or the like to the semiconductor region 105 (see FIG. 6A). At this time, a region of the semiconductor region 105 which is under the gate electrode 111 becomes the channel formation region 102 by formation of the impurity regions 104a. Note that although phosphorus or arsenic is added here to form an n-channel transistor, an impurity element such as boron (B) or aluminum (Al) may be added to form a p-channel transistor. The concentration of the impurity added can be set as appropriate; the concentration is preferably increased when the size of a semiconductor element is extremely decreased.

Next, an insulating film is formed so as to cover the gate electrode 111, the insulating film 108a, and the like and highly anisotropic etching treatment is performed on the insulating film to form the sidewall insulating film 107 in a self-aligned manner. At the same time, the insulating film 108a is etched to form the gate insulating film 108. The insulating film used for the sidewall insulating film 107 may be similar to the insulating film used as the insulating film 108a. As the etching, dry etching is preferably performed, but wet etching may be performed. An etching gas and an etchant can be selected as appropriate in accordance with a material to be etched.

Figure 6B:
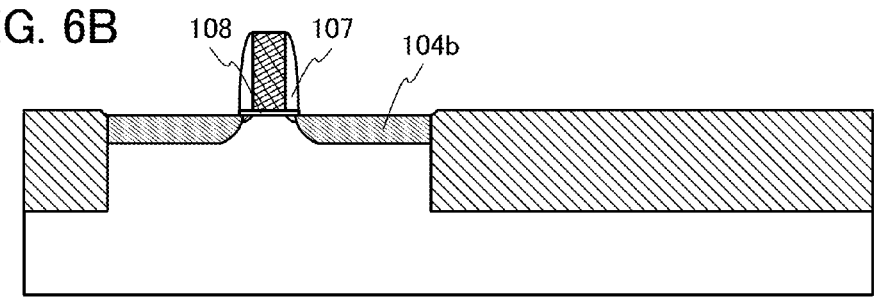
Figure 6C:
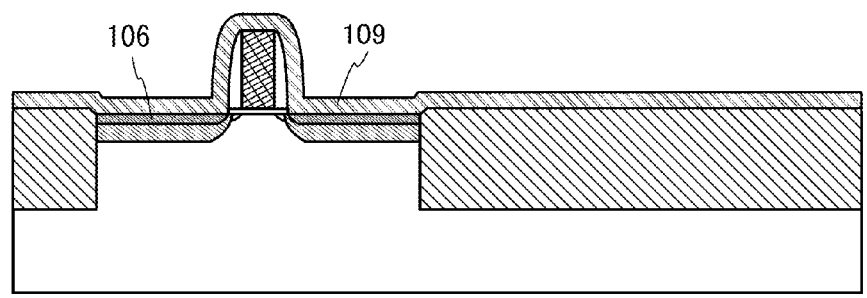

Then, phosphorus (P), arsenic (As), or the like is added to regions of the impurity regions 104a which do not overlap with the sidewall insulating film 107 to form the impurity regions 104b having a higher impurity concentration than the impurity regions 104a (see FIG. 6B). The impurity regions 104b can be formed in a manner similar to that used for the impurity regions 104a. An insulating film functioning as a protective film may be formed over the impurity regions 104a before the impurity regions 104b are formed.

After that, a metal layer 109 is formed so as to cover the gate electrode 111, the sidewall insulating film 107, the impurity regions 104a, the impurity regions 104b, and the like. The metal layer 109 can be formed by any of a variety of film formation methods such as a vacuum evaporation method, a sputtering method, and a spin coating method. The metal layer 109 is preferably formed using a metal material that forms a low-resistance intermetallic compound by reacting with a semiconductor material included in the semiconductor region 105. Examples of such a metal material are titanium, tantalum, tungsten, nickel, cobalt, and platinum.

Next, heat treatment is performed so that the metal layer 109 reacts with the semiconductor material. In this manner, the intermetallic compound regions 106 which are in contact with the impurity regions 104a and the impurity regions 104b are formed (see FIG. 6C). When the gate electrode 111 is formed using polycrystalline silicon or the like, an intermetallic compound region is also formed in a region of the gate electrode 111 in contact with the metal layer 109.

As the heat treatment, irradiation with a flash lamp can be employed, for example. Although different heat treatment may be employed, a method by which heat treatment for an extremely short time can be achieved is preferably employed in order to improve the controllability of chemical reaction in formation of the intermetallic compound. Note that the intermetallic compound regions are formed by reaction of the metal material and the semiconductor material, and have sufficiently high conductivity. The formation of the intermetallic compound regions can sufficiently reduce the electric resistance and can improve element characteristics. The metal layer 109 is removed after the formation of the intermetallic compound regions 106.

Then, the interlayer insulating film 103 is formed so as to cover the components formed in the above steps, and the connection electrode 112a and the connection electrode 112b are provided on and in contact with one of the intermetallic compound regions 106 and the other of the intermetallic compound regions 106, respectively, so as to be embedded in the interlayer insulating film 103. In addition, the wiring 114a and the wiring 114b are provided on and in contact with the connection electrode 112a and the connection electrode 112b, respectively, so as to be embedded in the interlayer insulating film 103. Here, the top surfaces of the wiring 114a and the wiring 114b are not covered with the interlayer insulating film 103.

Note that the interlayer insulating film 103, the connection electrode 112a, the connection electrode 112b, the wiring 114a, and the wiring 114b are similar to the interlayer insulating film 124, the connection electrode 126, and the wiring 128a which are in the wiring layer 120 and are described later; thus, the descriptions thereof can be referred to for the details.

Figure 6D:
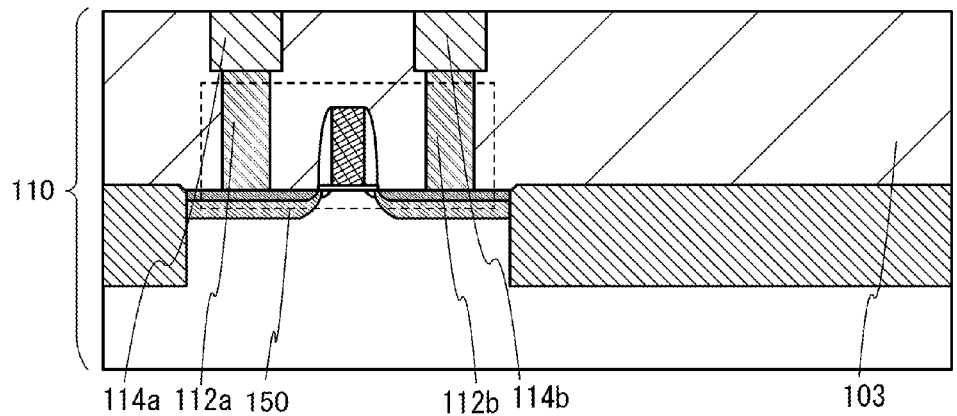

Through the above steps, the transistor 150 including the semiconductor substrate 100 is formed (see FIG. 6D). Such a transistor 150 can operate at high speed. In this manner, the first semiconductor element layer 110 including the transistor 150 can be formed.

<Method for Forming Wiring Layer>

Next, a method for forming the wiring layer 120 will be described with reference to FIGS. 7A to 7E.

First, the interlayer insulating film 122 is formed so as to cover the components of the first semiconductor element layer 110 and further, the interlayer insulating film 124a is formed over the interlayer insulating film 122.

The interlayer insulating film 122 is preferably an insulating film functioning as a barrier film which prevents entry of impurities diffused from the first semiconductor element layer 110. In particular, in the case where a single crystal silicon substrate, an SOI substrate, a substrate over which a semiconductor element formed using silicon or the like is provided, or the like is used as the semiconductor substrate 100, hydrogen or the like contained in the substrate can be prevented from being diffused and entering an oxide semiconductor film which is to be formed later. As such an interlayer insulating film 122, for example, a silicon nitride film, a silicon nitride oxide film, an aluminum oxide film, or the like formed by a plasma CVD method, a sputtering method, or the like can be used. In this embodiment, a silicon nitride film formed by a plasma CVD method is used as the interlayer insulating film 122. Note that in "silicon nitride oxide" in this specification and the like, the nitrogen content is higher than the oxygen content.

In particular, in the case where the wiring is formed using a metal containing copper, an inorganic insulating film having a high barrier property such as a silicon nitride oxide film or a silicon nitride film is preferably used because diffusion of copper can be prevented.

The interlayer insulating film 124a can be formed using a material including an inorganic insulating material such as silicon oxide, silicon oxynitride, silicon nitride oxide, silicon nitride, or aluminum oxide. In "silicon oxynitride" in this specification and the like, the oxygen content is higher than the nitrogen content. In particular, the interlayer insulating film 124a is preferably formed using a low dielectric constant (low-k) material because capacitance caused by the overlap of electrodes or wirings can be sufficiently reduced. Note that a porous insulating layer including any of these materials may be used for the interlayer insulating film 124a. Since the porous insulating layer has lower dielectric constant than a dense insulating layer, capacitance caused by the electrodes or wirings can be further reduced. Alternatively, the interlayer insulating film 124a can be formed using an organic insulating material such as polyimide or acrylic. There is no particular limitation on the method for forming the interlayer insulating film 124a, and any of a variety of deposition methods such as an evaporation method, a CVD method, a sputtering method, and a spin coating method can be used. The semiconductor device can be manufactured with higher efficiency by a CVD method or the like whose deposition rate is high. In this embodiment, the case where the interlayer insulating film 124a is formed using silicon oxide by a CVD method is described.

Figure 7A:
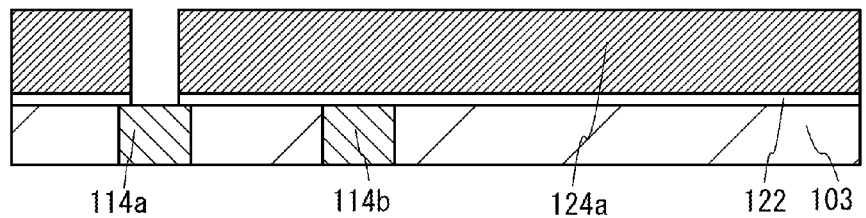
FIGS. 7A to 7E are cross-sectional views illustrating one embodiment of a method for manufacturing a semiconductor device.

Next, an opening which reaches the wiring 114a is formed in the interlayer insulating film 122 and the interlayer insulating film 124a (see FIG. 7A). The opening can be formed by a method such as etching using a mask. The mask can be formed by a method such as exposure using a photomask. Either wet etching or dry etching may be used as the etching; dry etching is preferably used in terms of microfabrication.

Figure 7B:
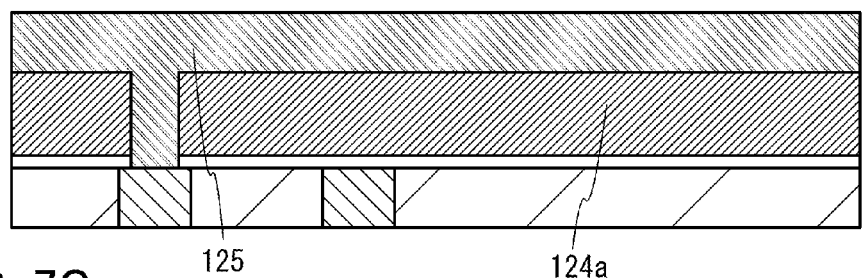

Then, a conductive layer 125 is formed to fill the opening which is formed in the interlayer insulating film 122 and the interlayer insulating film 124a (see FIG. 7B). The conductive layer 125 can be formed using a material and a method that are similar to those of the layer containing a conductive material that is used for the gate electrode 111.

Specifically, it is possible to use a method, for example, in which a thin titanium film is formed in a region including the opening by a PVD method, a thin titanium nitride film is formed by a CVD method, and then a tungsten film is formed to fill the opening. The titanium nitride film has a barrier function of inhibiting diffusion of the conductive material. In the case where the connection electrodes 112a and 112b are formed using such a conductive layer, a titanium film formed by a PVD method has a function of reducing an oxide film formed at an interface with the intermetallic compound region 106 so that the contact resistance therebetween is decreased.

Figure 7C:
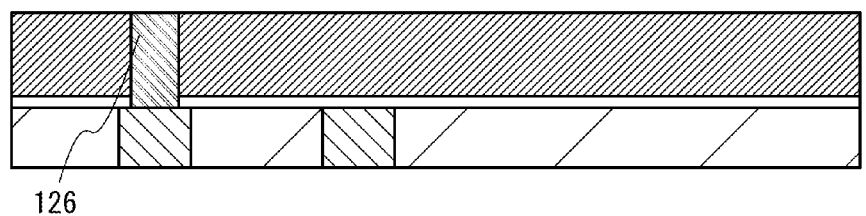

Next, part of the conductive layer 125 is removed by CMP treatment or etching treatment to expose the interlayer insulating film 124a, so that the connection electrode 126 is formed (see FIG. 7C). Here, the CMP treatment is treatment for planarizing a surface of an object to be processed by a combination of chemical and mechanical actions. In general, the CMP treatment is treatment in which a polishing cloth is attached to a polishing stage, the polishing stage and the object to be processed are each rotated or swung while a slurry (abrasive) is supplied between the object to be processed and the polishing cloth, and the surface of the object to be processed is polished by chemical reaction of the slurry and the surface of the object to be processed and by action of mechanical polishing of the object to be processed with the polishing cloth.

Figure 7D:
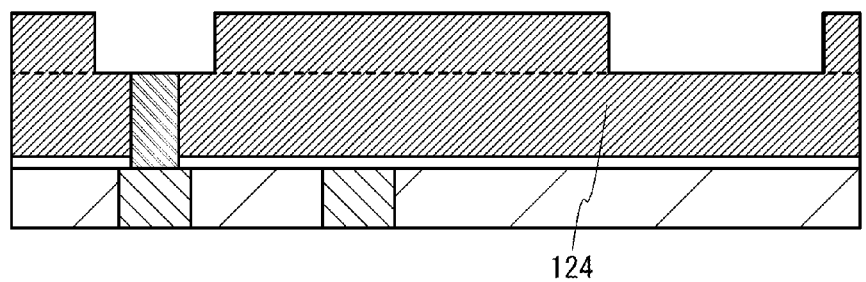

Then, an insulating film is formed over the interlayer insulating film 124a and the connection electrode 126, an opening which reaches the connection electrode 126 is formed, and an opening which is filled by the electrode 128b is formed in a position where the capacitor 154 is to be formed later; thus, the interlayer insulating film 124 is formed (see FIG. 7D). The openings can be formed by a method similar to the above method. Note that although an insulating film formed using the same material as the interlayer insulating film 124a is used as the insulating film in this embodiment, one embodiment of the present invention is not limited thereto. The insulating film may have a structure in which two or more kinds of insulating films are stacked.

Figure 7E:
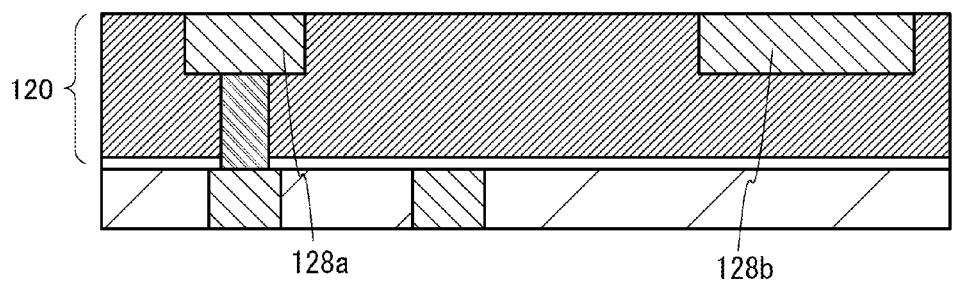

After that, a conductive layer is formed to fill the openings formed in the interlayer insulating film 124, and part of the conductive layer is removed by CMP treatment or etching treatment to expose the interlayer insulating film 124; thus, the wiring 128a and the electrode 128b are formed (see FIG. 7E). At this time, the top surfaces of the interlayer insulating film 124, the wiring 128a, and the electrode 128b are preferably in substantially the same plane. The surfaces of the interlayer insulating film 124, the wiring 128a, and the electrode 128b are planarized as described above, whereby a favorable electrode, wiring, insulating layer, semiconductor layer, and the like can be formed in later steps.

The conductive layer can be formed using a material and a method that are similar to those of the layer containing a conductive material that is used for the connection electrode 126. In particular, it is preferable that copper (Cu) or a conductive material containing copper be used in the case of reducing wiring resistance. In that case, a conductive layer of copper or a conductive material containing copper is provided between layers each formed using a conductive material containing an element which has a higher melting point than Cu, such as W, Ta, Mo, Ti, or Cr, so that migration of the wiring 128a or the like can be suppressed and reliability of the semiconductor device can be improved.

Here, the CMP treatment may be performed once or more than once. When the CMP treatment is performed more than once, it is preferable that first polishing be performed at a high polishing rate and then final polishing be performed at a low polishing rate. By performing polishing at different polishing rates, the surface flatness of the interlayer insulating film 124, the wiring 128a, and the electrode 128b can be further improved.

In such a manner, the electrode 128b included in the capacitor 154 is formed using the same layer and the same material in the same step as the wiring 128a. According to this, the capacitor 154 can be formed without unnecessary steps in the process of forming the wiring layer 120 and the transistor 152 in the second semiconductor element layer 130, so that the semiconductor element and the capacitor can be efficiently formed.

Note that the interlayer insulating film 103, the connection electrodes 112a and 112b, and the wirings 114a and 114b can be formed using materials and methods that are similar to those of the interlayer insulating film 124, the connection electrode 126, and the wiring 128a.

Through the above steps, the wiring layer 120 can be formed.

Note that the method for forming the wiring layer 120 is not limited to the method described with reference to FIGS. 7A to 7E. For example, openings for the connection electrode 126, the wiring 128a, and the electrode 128b can be formed in the interlayer insulating film 124 and then the openings can be filled with a conductive material to form the connection electrode 126, the wiring 128a, and the electrode 128b. In that case, the connection electrode 126, the wiring 128a, and the electrode 128b are formed using the same material.

<Method for Forming Second Semiconductor Element Layer>

Then, a method for forming the second semiconductor element layer 130 will be described with reference to FIGS. 8A to 8D and FIGS. 9A to 9C.

First, the base insulating film 132a is formed over the interlayer insulating film 124, the wiring 128a, and the electrode 128b, and the base insulating film 132b is formed over the base insulating film 132a.

The base insulating film 132a is preferably an insulating film functioning as a barrier film which prevents entry of impurities diffused from under the base insulating film 132a. In particular, in the case where a single crystal silicon substrate, an SOI substrate, a substrate over which a semiconductor element formed using silicon or the like is provided, or the like is used as the semiconductor substrate 100, hydrogen or the like contained in the substrate can be prevented from being diffused and entering the oxide semiconductor film which is to be formed later. As such a base insulating film 132a, for example, a silicon nitride film, a silicon nitride oxide film, an aluminum oxide film, or the like formed by a plasma CVD method, a sputtering method, or the like can be used.

In this embodiment, a silicon nitride film formed by a plasma CVD method is used as the base insulating film 132a.

The base insulating film 132b is preferably an insulating film containing excess oxygen (insulating film containing oxygen in excess of that in the stoichiometric composition) because oxygen vacancy in an oxide semiconductor film formed later can be repaired by the excess oxygen contained in the base insulating film 132b. To form the base insulating film 132b containing excess oxygen, the base insulating film 132b may be formed in an oxygen atmosphere, for example. Alternatively, an oxygen-excess region may be formed by implanting oxygen (including at least one of an oxygen radical, an oxygen atom, and an oxygen ion) into the base insulating film 132b after its deposition. Oxygen can be implanted by an ion implantation method, an ion doping method, a plasma immersion ion implantation method, plasma treatment, or the like.

As such a base insulating film 132b, for example, a silicon oxynitride film, a silicon oxide film, or the like formed by a plasma CVD method, a sputtering method, or the like can be used. Oxygen can be supplied to any of these insulating films with, for example, an apparatus for etching treatment on a semiconductor device or an apparatus for ashing on a resist mask. In "silicon oxynitride" in this specification and the like, the oxygen content is higher than the nitrogen content.

In this embodiment, a silicon oxynitride film which is formed by a plasma CVD method and subjected to plasma treatment in an atmosphere containing oxygen to contain excessive oxygen is used as the base insulating film 132b.

Here, the base insulating film 132b is preferably subjected to polishing treatment (e.g., CMP treatment), dry etching treatment, plasma treatment, or the like to improve the surface flatness of the base insulating film 132b. With such a base insulating film 132b having the improved surface flatness, the crystallinity of the oxide semiconductor film 134 provided over the base insulating film 132b can be improved.

As plasma treatment, for example, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to a surface on which the oxide semiconductor film 134 is formed.

As the treatment for improving the flatness, polishing treatment, dry etching treatment, or plasma treatment may be performed plural times, or these treatments may be performed in combination. In the case where the treatments are combined, the order of steps is not particularly limited and may be set as appropriate depending on the roughness of the surface on which the oxide semiconductor film 134 is formed.

Here, the surface flatness of a region of the base insulating film 132b which is to overlap with the channel formation region 134c later is particularly preferably improved. Specifically, the average surface roughness ($R_a$) of the region of the base insulating film 132b is preferably less than or equal to 0.15 nm, further preferably less than or equal to 0.1 nm.

Next, an oxide semiconductor film is formed over the base insulating film 132b. The oxide semiconductor film may have either a single-layer structure as described above or a stacked structure. Further, the oxide semiconductor film may be either an amorphous oxide semiconductor film or a crystalline oxide semiconductor film. In the case where the oxide semiconductor film has an amorphous structure, heat treatment may be performed on the oxide semiconductor film having an amorphous structure in a later manufacturing step to form a crystalline oxide semiconductor film. The heat treatment for crystallizing the amorphous oxide semiconductor film is performed at a temperature higher than or equal to 250° C. and lower than or equal to 700° C., preferably higher than or equal to 400° C., further preferably higher than or equal to 500° C., still further preferably higher than or equal to 550° C. Note that the heat treatment can also serve as another heat treatment in the manufacturing process. The thickness of the oxide semiconductor film is preferably, for example, greater than or equal to 1 nm and less than or equal to 30 nm, further preferably greater than or equal to 5 nm and less than or equal to 10 nm.

The oxide semiconductor film can be formed by a sputtering method, a molecular beam epitaxy (MBE) method, a CVD method, a pulse laser deposition method, an atomic layer deposition (ALD) method, or the like as appropriate. The oxide semiconductor film may be formed using a sputtering apparatus which performs film formation with surfaces of a plurality of substrates set substantially perpendicular to a surface of a sputtering target.

In the formation of the oxide semiconductor film, the concentration of hydrogen contained in the oxide semiconductor film is preferably reduced as much as possible. To reduce the hydrogen concentration, for example, in the case where the oxide semiconductor film is formed by a sputtering method, oxygen, a high-purity rare gas (typically, argon) from which impurities such as hydrogen, water, a hydroxyl group, and hydride have been removed, or a mixed gas of oxygen and the rare gas is used as appropriate as an atmosphere gas supplied to a deposition chamber of a sputtering apparatus.

The oxide semiconductor layer is formed in such a manner that a sputtering gas from which hydrogen and moisture are removed is introduced into a deposition chamber while moisture remaining in the deposition chamber is removed, whereby the concentration of hydrogen in the oxide semiconductor film can be reduced. In order to remove moisture remaining in the deposition chamber, an entrapment vacuum pump such as a cryopump, an ion pump, or a titanium sublimation pump is preferably used. As an evacuation unit, a turbo molecular pump to which a cold trap is added may be used. The cryopump has a high capability in removing a hydrogen molecule, a compound containing a hydrogen atom such as water ($H_2O$) (further preferably, also a compound containing a carbon atom), and the like; thus, the impurity concentration in the oxide semiconductor film formed in the deposition chamber which is evacuated with the cryopump can be reduced.

Further, in the case where the oxide semiconductor film is formed by a sputtering method, the relative density (the fill rate) of a metal oxide target which is used for forming the oxide semiconductor film is greater than or equal to 90% and less than or equal to 100%, preferably greater than or equal to 95% and less than or equal to 99.9%. With the use of a metal oxide target with a high relative density, a dense oxide semiconductor film can be formed.

To reduce the impurity concentration in the oxide semiconductor film, it is also effective to form the oxide semiconductor film while the semiconductor substrate 100 is kept at high temperature. The temperature at which the semiconductor substrate 100 is heated may be higher than or equal to 150° C. and lower than or equal to 450° C.; the substrate temperature is preferably higher than or equal to 200° C. and lower than or equal to 350° C. A crystalline oxide semiconductor film can be formed by heating the substrate at a high temperature in the formation.

In the case where a sputtering method is used, a target may be set as appropriate depending on the material of the oxide semiconductor film 134 and its composition. For example, an In—Ga—Zn-based oxide with an atomic ratio where In:Ga:Zn=1:1:1, In:Ga:Zn=1:3:2, In:Ga:Zn=3:1:2, or In:Ga:Zn=2:1:3, or an oxide whose composition is in the neighborhood of the above compositions can be used as a target. However, a material and composition of a target are not limited to the above.

The oxide semiconductor film is preferably formed under conditions such that much oxygen is contained (for example, by a sputtering method in an atmosphere where the proportion of oxygen is 100%) so as to be a film containing much oxygen (preferably including a region containing oxygen in excess of that in the stoichiometric composition of the oxide semiconductor in a crystalline state).

It is preferable to use a high-purity gas from which impurities such as hydrogen, water, a hydroxyl group, or hydride are removed as a sputtering gas used when the oxide semiconductor film is formed.

There are three methods for obtaining a CAAC-OS film when the CAAC-OS film is used as the oxide semiconductor film. The first method is to deposit the oxide semiconductor film at a deposition temperature higher than or equal to 200° C. and lower than or equal to 450° C., thereby obtaining c-axis alignment substantially perpendicular to a surface. The second method is to form a thin oxide semiconductor film and then subject the film to heat treatment performed at a temperature higher than or equal to 200° C. and lower than or equal to 700° C., thereby obtaining c-axis alignment substantially perpendicular to a surface. The third method is to form a first thin oxide semiconductor film, subject the film to heat treatment performed at a temperature higher than or equal to 200° C. and lower than or equal to 700° C., and then form a second oxide semiconductor film, thereby obtaining c-axis alignment substantially perpendicular to a surface.

Further, the oxide semiconductor film is preferably subjected to heat treatment in an electric furnace or the like for removing excess hydrogen (including water and a hydroxyl group) in the oxide semiconductor film (dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like.

Note that an apparatus used for this heat treatment is not limited to an electric furnace, and a device for heating a process object by heat conduction or heat radiation from a heating element such as a resistance heating element may be alternatively used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for the heat treatment using a high-temperature gas. As the high-temperature gas, an inert gas which does not react with an object to be processed by heat treatment, such as nitrogen or a rare gas like argon, is used.

For example, the heat treatment using a GRTA apparatus may be performed as follows. The substrate is put in an inert gas heated at high temperature of 650° C. to 700° C., is heated for several minutes, and is taken out of the inert gas.

Note that in the heat treatment, it is preferable that water, hydrogen, and the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

Hydrogen, which is an impurity imparting n-type conductivity, can be removed from the oxide semiconductor film by the heat treatment. For example, the hydrogen concentration in the oxide semiconductor film after the dehydration or dehydrogenation treatment can be lower than or equal to $5 \times 10^{19}/cm^3$, preferably lower than or equal to $5 \times 10^{18}/cm^3$.

Note that the heat treatment for dehydration or dehydrogenation may be performed at any timing in the process of manufacturing the transistor 152 as long as the heat treatment is performed after the formation of the oxide semiconductor film. In the case where an aluminum oxide film is used as the gate insulating film 136a or the protective insulating film 144, the heat treatment is preferably performed before the aluminum oxide film is formed. The heat treatment for dehydration or dehydrogenation may be performed plural times and may also serve as another heat treatment.

In addition, after the oxide semiconductor film is heated in the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, further preferably less than or equal to 10 ppb, in the measurement with use of a dew point meter of a cavity ring down laser spectroscopy (CRDS) system) may be introduced into the same furnace while the heating temperature is maintained or slow cooling is performed to lower the temperature from the heating temperature. It is preferable that water, hydrogen, or the like be not contained in the oxygen gas or the dinitrogen monoxide gas. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is 1 ppm or lower, further preferably 0.1 ppm or lower). The oxygen gas or the dinitrogen monoxide gas acts to supply oxygen that is a main component of the oxide semiconductor and that has been reduced by removing an impurity for the dehydration or dehydrogenation, so that the oxide semiconductor film can have high purity and be an i-type (intrinsic) semiconductor. By using such a highly purified oxide semiconductor film, the transistor which has extremely favorable off-state characteristics can be obtained.

Further or alternatively, oxygen (which includes at least one of oxygen radicals, oxygen atoms, and oxygen ions) may be introduced into the oxide semiconductor film that has been subjected to the dehydration or dehydrogenation treatment to supply oxygen to the oxide semiconductor film.

In the step of introducing oxygen, oxygen may be directly introduced to the oxide semiconductor film or introduced to the oxide semiconductor film through another film such as the gate insulating film 136a which is to be formed later. An ion implantation method, an ion doping method, a plasma immersion ion implantation method, or the like may be employed in the case where oxygen is introduced through another film, whereas plasma treatment or the like can be employed in addition to the above methods in the case where oxygen is directly introduced to the oxide semiconductor film in an exposed state.

Oxygen can be introduced into the oxide semiconductor film anytime after dehydration or dehydrogenation treatment is performed thereon. Further, oxygen may be introduced plural times into the dehydrated or dehydrogenated oxide semiconductor film. In the case where the oxide semiconductor film has a stacked-layer structure including a plurality of layers, oxygen may be introduced each time the oxide semiconductor layer is formed.

Figure 8A:
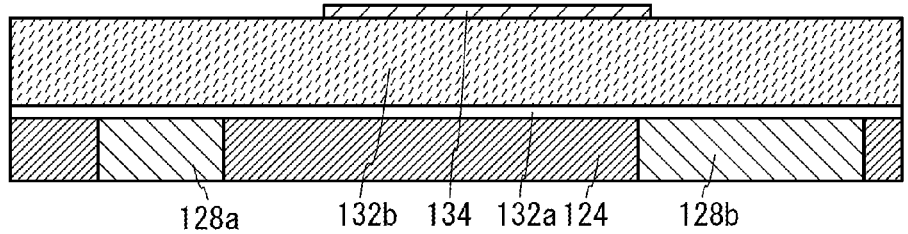
FIGS. 8A to 8D are cross-sectional views illustrating one embodiment of a method for manufacturing a semiconductor device.

Next, the oxide semiconductor film can be formed into the island-shaped oxide semiconductor film 134 by a photolithography process (see FIG. 8A).

A resist mask for forming the island-shaped oxide semiconductor film 134 may be formed by an inkjet method. Formation of the resist mask by an inkjet method needs no photomask; thus, manufacturing cost can be reduced.

Note that as the etching of the oxide semiconductor film 134, dry etching, wet etching, or both of the dry etching and wet etching may be employed. As an etchant used for wet etching of the oxide semiconductor film, for example, a mixed solution of phosphoric acid, acetic acid, and nitric acid, or the like can be used. Alternatively, ITO-07N (produced by KANTO CHEMICAL CO., INC.) may be used. It is also possible to employ dry etching by an inductively coupled plasma (ICP) etching method.

Next, an opening is formed in a region of the base insulating film 132b which overlaps with the electrode 128b. The opening can be formed using a method similar to that used for formation of the opening in the interlayer insulating film 124. In the case where the semiconductor device illustrated in FIG. 2 or FIG. 3, the base insulating film 132a is etched together with the base insulating film 132b to form an opening so that the top surface of the electrode 128b is exposed.

Figure 8B:
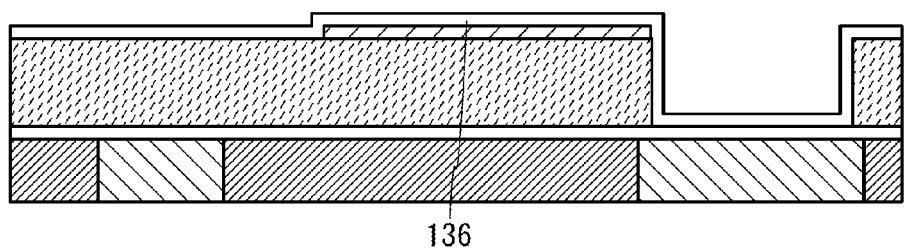

Then, an insulating film 136 which is to be the gate insulating film 136a and the insulating film 136b in a later step is formed so as to cover the oxide semiconductor film 134 (see FIG. 8B). Here, the thickness of the insulating film 136 is preferably greater than or equal to 1 nm and less than or equal to 20 nm, for example.

The insulating film 136 is preferably an insulating film containing excess oxygen (insulating film containing oxygen in excess of that in the stoichiometric composition) because oxygen vacancy in the oxide semiconductor film 134 can be repaired by the excess oxygen contained in the insulating film 136. To form the insulating film 136 containing excess oxygen, the insulating film 136 may be formed in an oxygen atmosphere, for example. Alternatively, an oxygen-excess region may be formed by implanting oxygen (including at least one of an oxygen radical, an oxygen atom, and an oxygen ion) into the insulating film 136 after its deposition. Oxygen can be implanted by an ion implantation method, an ion doping method, a plasma immersion ion implantation method, plasma treatment, or the like.

As such an insulating film 136, for example, a silicon oxynitride film, a silicon oxide film, or the like formed by a plasma CVD method, a sputtering method, or the like can be used. Oxygen can be supplied to any of these insulating films with, for example, an apparatus for etching treatment on a semiconductor device or an apparatus for ashing on a resist mask. In this embodiment, a silicon oxynitride film which is formed by a plasma CVD method and subjected to plasma treatment in an atmosphere containing oxygen to contain excessive oxygen is used as the insulating film 136.

Further, the insulating film 136 can have a stacked-layer structure and an insulating film functioning as a barrier film like the insulating film that is used as the base insulating film 132a may be provided over the insulating film containing excess oxygen. In the case where an aluminum oxide film is used as the insulating film functioning as a barrier film, the aluminum oxide film can be formed in the following manner: an aluminum film is formed by a plasma CVD method, a sputtering method, or the like, and then plasma treatment is performed in an atmosphere containing oxygen.

In particular, an aluminum oxide film has a high shielding effect (blocking effect) which prevents permeance of both oxygen and impurities such as hydrogen and moisture through the film. Thus, in and after the manufacturing process, the aluminum oxide film functions as a barrier film for preventing entry of impurities such as hydrogen and moisture, which might cause variation in characteristics, into the oxide semiconductor film 134 and release of oxygen, which is a main component material of the oxide semiconductor, from the oxide semiconductor film 134.

In addition, heat treatment may be performed after the formation of the insulating film 136, so that the oxygen contained in the insulating film 136, the amount of which exceeds that in the stoichiometric composition, can be supplied to the oxide semiconductor film 134. The heat treatment is preferably performed at higher than or equal to 250° C. and lower than or equal to 700° C., higher than or equal to 400° C. and lower than or equal to 700° C., or lower than the strain point of the substrate. The substrate is put in an electric furnace which is a kind of heat treatment apparatus and heat treatment is performed at 250° C. in a nitrogen atmosphere for 1 hour, for example.

At this time, the insulating film containing excess oxygen from which oxygen is supplied is covered with a dense barrier film, whereby upward diffusion of oxygen from the insulating film containing excess oxygen from which oxygen is supplied can be prevented, so that oxygen can be supplied to the oxide semiconductor film 134.

The heat treatment is performed on the insulating film containing excess oxygen from which oxygen is supplied while the insulating film is covered with the dense barrier film as described above, so that the oxide semiconductor film 134 can be put in a state where the proportion of oxygen substantially corresponds to that in the stoichiometric composition or a supersaturated state where the proportion of oxygen is higher than that in the stoichiometric composition.

By removing hydrogen or moisture from the oxide semiconductor film to highly purify the oxide semiconductor film so as not to contain impurities as much as possible, and supplying oxygen to repair oxygen vacancy therein, the oxide semiconductor film can be turned into an i-type (intrinsic) oxide semiconductor or a substantially i-type (intrinsic) oxide semiconductor film. This enables the Fermi level ($E_f$) of the oxide semiconductor film to be at the same level as the intrinsic Fermi level ($E_i$) thereof. Accordingly, by using the oxide semiconductor film for a transistor, fluctuation in the threshold voltage $V_{th}$ of the transistor due to oxygen vacancy and a shift of the threshold voltage $\Delta V_{th}$ can be reduced.

Next, the gate electrode 138a is formed over the insulating film 136 to overlap with the oxide semiconductor film 134 and the electrode 138b is formed in the opening provided in the base insulating film 132b to overlap with the electrode 128b. The gate electrode 138a and the electrode 138b can be formed by a plasma CVD method, a sputtering method, or the like. The gate electrode 138a and the electrode 138b can be formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. Alternatively, the gate electrode 138a and the electrode 138b may be formed using a semiconductor film typified by a polycrystalline silicon film doped with an impurity element such as phosphorus, or a silicide film such as a nickel silicide film. The gate electrode 138a and the electrode 138b may have a single-layer structure or a stacked-layer structure.

The gate electrode 138a and the electrode 138b can also be formed using a conductive material such as an indium oxide-tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon oxide is added. It is also possible that the gate electrode 138a and the electrode 138b have a stacked-layer structure of the above conductive material and the above metal material.

As one layer of the gate electrode 138a which is in contact with the insulating film 136, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function of 5 eV or higher, preferably 5.5 eV or higher, which enables the threshold voltage of the transistor to take a positive value when used as the gate electrode layer, so that a switching element of what is called normally-off type can be achieved.

Note that the gate electrode 138a can be formed by processing a conductive film (not illustrated) provided over the insulating film 136 with the use of a mask. Here, as the mask used for the processing, a mask having a finer pattern which is formed by performing a slimming process on a mask formed by a photolithography method or the like can be used.

As the slimming process, an ashing process in which oxygen in a radical state (an oxygen radical) is used can be employed, for example. However, the slimming process is not limited to the ashing process as long as the mask formed by a photolithography method or the like can be processed into a finer pattern. Note that the channel length (L) of a transistor is determined by the mask formed by the slimming process; thus, a process with high controllability can be employed as the slimming process. As a result of the slimming process, the line width of the mask formed by a photolithography method or the like can be reduced to a length shorter than or equal to the resolution limit of a light exposure apparatus, preferably less than or equal to half of the resolution limit of a light exposure apparatus, further preferably less than or equal to one third of the resolution limit of the light exposure apparatus. This enables further miniaturization of the transistor.

In such a manner, the electrode 138b included in the capacitor 154 is formed using the same layer and the same material in the same step as the gate electrode 138a. According to this, the capacitor 154 can be formed without unnecessary steps in the process of forming the wiring layer 120 and the transistor 152 in the second semiconductor element layer 130, so that the semiconductor element and the capacitor can be efficiently formed.

Figure 8C:
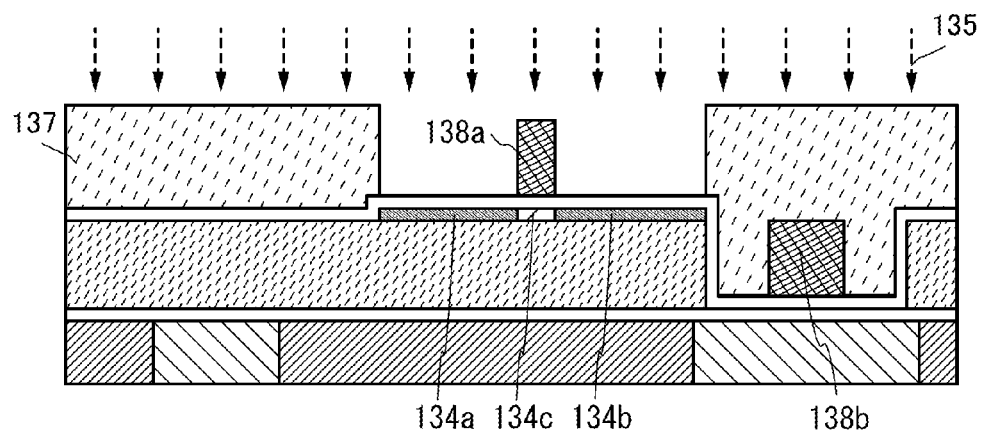
Figure 8D:
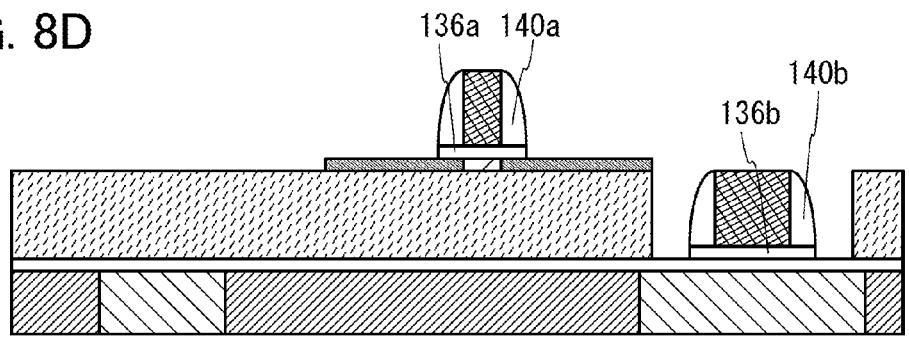

Next, an impurity element 135 is introduced into the oxide semiconductor film 134 with the use of the gate electrode 138a as a mask to form the impurity region 134a, the impurity region 134b, and the channel formation region 134c in a self-aligned manner (see FIG. 8C). Accordingly, the channel formation region 134c is formed between the impurity region 134a and the impurity region 134b. Note that as illustrated in FIG. 8C, a resist mask 137 or the like may be provided over a region into which the impurity element 135 needs not to be introduced so that the impurity is not introduced into the region.

The impurity element 135 is preferably an impurity by which the electrical conductivity of the oxide semiconductor film 134 is changed. One or more selected from the following can be used as the impurity element 135: Group 15 elements (typical examples thereof are nitrogen (N), phosphorus (P), arsenic (As), and antimony (Sb)), boron (B), aluminum (Al), argon (Ar), helium (He), neon (Ne), indium (In), fluorine (F), chlorine (Cl), titanium (Ti), and zinc (Zn).

As a method for introducing the impurity element 135, an ion implantation method, an ion doping method, or the like can be used. In that case, a single ion of the impurity element 135, or a fluoride ion or chloride ion thereof can also be used.

In particular, in the case where an oxide semiconductor film having crystallinity such as a CAAC-OS film is used as the oxide semiconductor film 134, an element whose atomic weight is large such as argon is introduced by an ion implantation method or an ion doping method, so that part of the oxide semiconductor film 134 becomes amorphous have an n-type conductivity; thus, the impurity region 134a and the impurity region 134b which have lower resistivity than the channel formation region 134c can be formed.

The introduction of the impurity element 135 may be controlled by setting the implantation conditions such as the accelerated voltage and the dosage, or the thickness of the film through which the dopant passes as appropriate.

The impurity element 135 may be introduced with the semiconductor substrate 100 heated. Alternatively, heat treatment may be performed after the impurity element 135 is introduced.

Note that the impurity element 135 may be introduced into the oxide semiconductor film 134 plural times, and the number of kinds of impurity elements may be plural.

Then, an insulating film is formed over the insulating film 136, the gate electrode 138a, and the electrode 138b and the insulating film is etched, whereby the sidewall insulating film 140a which is in contact with at least the side surfaces of the gate electrode 138a and the sidewall insulating film 140b which is in contact with at least side surfaces of the electrode 138b are formed. At this time, the insulating film 136 is also etched, so that the gate insulating film 136a overlapping with the gate electrode 138a and the sidewall insulating film 140a, and the insulating film 136b overlapping with the electrode 138b and the sidewall insulating film 140b are formed (see FIG. 8D). Here, for the insulating film used for the sidewall insulating film 140a and the sidewall insulating film 140b, a material similar to that used for the insulating film 136 can be used.

In the etching, the selectivity of the insulating film 136 to the base insulating film 132b is preferably high. For example, a silicon oxide film or a silicon oxynitride film may be used as the insulating film 136 and a silicon nitride film may be used as the base insulating film 132b, as described above.

The sidewall insulating film 140a and the sidewall insulating film 140b can be formed in a self-aligned manner by performing a highly anisotropic etching step on the above insulating film. For example, a dry etching method is preferably employed. As an etching gas used for the dry etching method, for example, a gas including fluorine such as trifluoromethane, octafluorocyclobutane, or tetrafluoromethane can be used. A rare gas or hydrogen may be added to the etching gas. As the dry etching method, a reactive ion etching (RIE) method in which high-frequency voltage is applied to a substrate is preferably used.

Although the sidewall insulating film 140a and the sidewall insulating film 140b are provided in contact with the side surfaces of the gate electrode 138a and the electrode 138b, an insulating film which also covers the top surface may be formed by photolithography. Alternatively, an insulating film may be provided to overlap with the top surfaces of the gate electrode 138a and the electrode 138b in addition to the sidewall insulating film 140a and the sidewall insulating film 140b.

In such a manner, the insulating film 136b included in the capacitor 154 is formed using the same layer and the same material in the same step as the gate insulating film 136a. According to this, the capacitor 154 can be formed without unnecessary steps in the process of forming the wiring layer 120 and the transistor 152 in the second semiconductor element layer 130, so that the semiconductor element and the capacitor can be efficiently formed.

Figure 9A:
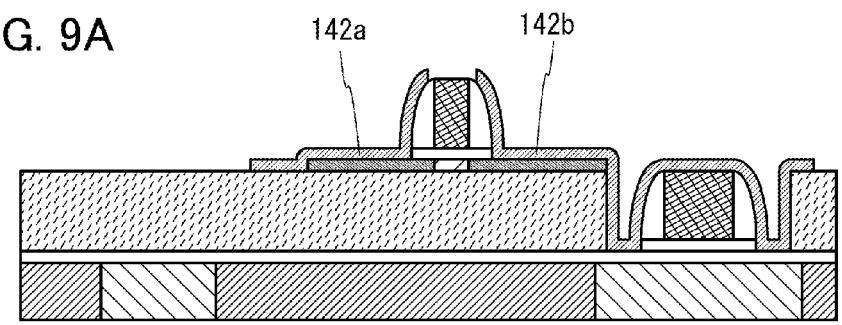
FIGS. 9A to 9C are cross-sectional views illustrating one embodiment of a method for manufacturing a semiconductor device.

Next, a conductive film is formed over the base insulating film 132b, the oxide semiconductor film 134, the gate electrode 138a, the electrode 138b, the sidewall insulating film 140a, and the sidewall insulating film 140b, and the conductive film is processed to form the source electrode 142a and the drain electrode 142b (see FIG. 9A).

Here, as the conductive film used for the source electrode 142a and the drain electrode 142b, for example, a metal film containing an element selected from Al, Cr, Cu, Ta, Ti, Mo, and W, or a metal nitride film containing any of the above elements as a component (a titanium nitride film, a molybdenum nitride film, or a tungsten nitride film) can be used. A film of a high-melting-point metal such as Ti, Mo, W, or the like or a metal nitride film of any of these elements (a titanium nitride film, a molybdenum nitride film, and a tungsten nitride film) may be stacked on one of or both of a lower side and an upper side of a metal film of Al, Cu, or the like. As the conductive film, a conductive metal oxide may be used. As the conductive metal oxide, indium oxide ($In_2O_3$), tin oxide ($SnO_2$), zinc oxide (ZnO), indium oxide-tin oxide ($In_2O_3$—$SnO_2$, which is abbreviated to ITO), indium oxide-zinc oxide ($In_2O_3$—ZnO), or any of these metal oxide materials in which silicon oxide is contained can be used.

To form the source electrode 142a and the drain electrode 142b, a resist mask is formed over the conductive film by a photolithography process, and at least the conductive film over the gate electrode 138a is removed by selective etching. As a result, the conductive film is divided with the gate electrode 138a provided therebetween and thus can function as the source electrode 142a and the drain electrode 142b.

In the photolithography process, an ultraviolet lamp, a KrF laser, or an ArF laser is preferably used as a light source of a light exposure apparatus. Accordingly, the channel length of the transistor 152 can be reduced (specifically, to less than or equal to 100 nm, preferably less than or equal to 60 nm, further preferably less than or equal to 30 nm); thus, the operation speed of the transistor 152 can be increased. When light exposure is performed for a channel length less than 25 nm, the light exposure for forming the resist mask in the photolithography process is preferably performed using extreme ultraviolet light having an extremely short wavelength of several nanometers to several tens of nanometers, for example. In the light exposure by extreme ultraviolet light, the resolution is high and the focus depth is large.

Note that as a method for forming the source electrode 142a and the drain electrode 142b except the above, there is a method in which a planarization film is formed over the conductive film and the planarization film and the conductive film are polished by CMP treatment to form the source electrode 142a and the drain electrode 142b. At this time, with an insulating film provided over the gate electrode 138a and the electrode 138b as described above, these electrodes can be prevented from being polished.

In FIG. 9A, the drain electrode 142b is formed in contact with the oxide semiconductor film 134 and the electrode 138b. In the case where the semiconductor device illustrated in FIG. 2 is formed, the drain electrode 142b is provided in contact with the electrode 128b through the above opening and not to be in contact with the electrode 138b. In the case where the semiconductor device illustrated in FIG. 3 is formed, the drain electrode 142b is provided not to overlap with the opening of the base insulating film 132b.

Figure 9B:
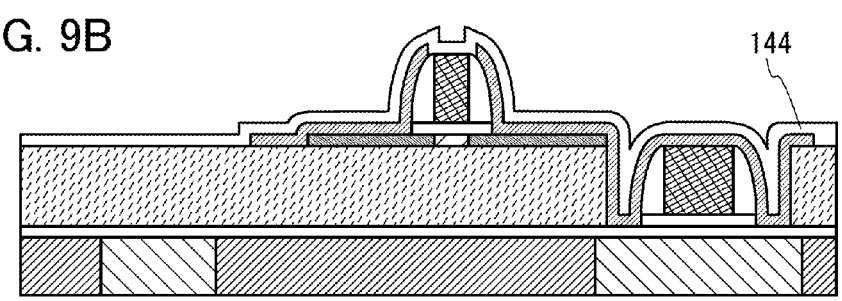

Next, the protective insulating film 144 is formed over the base insulating film 132b, the gate electrode 138a, the source electrode 142a, and the drain electrode 142b (see FIG. 9B).

The protective insulating film 144 can be formed by a plasma CVD method, a sputtering method, an evaporation method, or the like. As the protective insulating film 144, an inorganic insulating film such as a silicon oxide film, a silicon oxynitride film, an aluminum oxynitride film, or a gallium oxide film can be used as a typical example.

Alternatively, as the protective insulating film 144, an aluminum oxide film, a hafnium oxide film, a magnesium oxide film, a zirconium oxide film, a lanthanum oxide film, a barium oxide film, or a metal nitride film (e.g., an aluminum nitride film) can be used. In particular, the aluminum oxide film is preferably used because it has a high shielding effect (blocking effect) which prevents permeance of both oxygen and impurities such as hydrogen and moisture, and in and after the manufacturing process, the aluminum oxide film functions as a protective film for preventing entry of an impurity such as hydrogen or moisture, which causes a change in characteristics, into the oxide semiconductor film 134 and release of oxygen, which is a main constituent material of the oxide semiconductor, from the oxide semiconductor film 134.

Note that the protective insulating film 144 may be a single layer or a stack of layers.

The protective insulating film 144 is preferably formed using, as appropriate, a method such as a sputtering method, in which an impurity such as water or hydrogen does not enter the protective insulating film 144. As in the case of forming the oxide semiconductor film 134, an entrapment vacuum pump (e.g., a cryopump) is preferably used to remove moisture remaining in a deposition chamber used for forming the protective insulating film 144. When the protective insulating film 144 is formed in the deposition chamber evacuated using a cryopump, the impurity concentration of the protective insulating film 144 can be reduced. A turbo molecular pump provided with a cold trap may be used as an evacuation unit for removing moisture remaining in the deposition chamber used for forming the protective insulating film 144.

Then, the interlayer insulating film 146 is formed so as to cover the components formed in the above steps; an opening where the wiring 128a is exposed is formed in the interlayer insulating film 146, the protective insulating film 144, the base insulating film 132a, and the base insulating film 132b; an opening where the source electrode 142a is exposed is formed in the interlayer insulating film 146 and the protective insulating film 144; and the connection electrode 148a and the wiring 149a, and the connection electrode 148b and the wiring 149b are formed to fill the openings.

Note that the interlayer insulating film 146, the connection electrode 148a, the connection electrode 148b, the wiring 149a, and the wiring 149b are similar to the interlayer insulating film 124, the connection electrode 126, and the wiring 128a which are in the wiring layer 120; thus, the descriptions thereof can be referred to for the details.

Figure 9C:
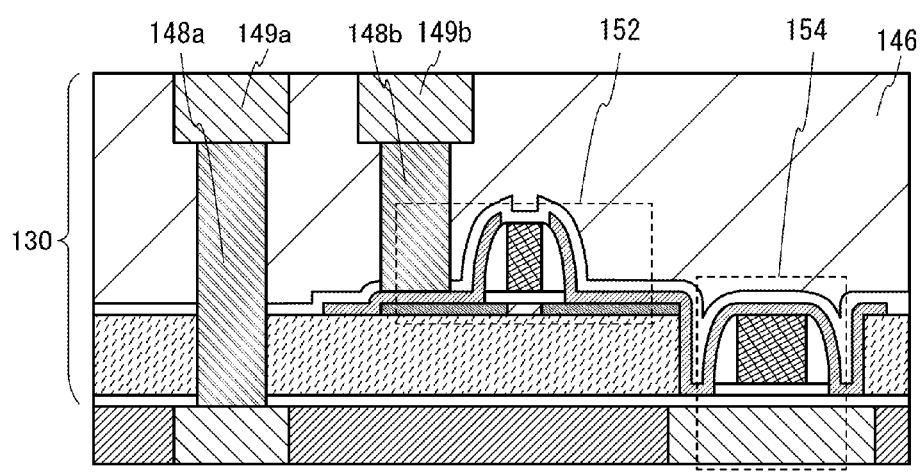

Thus, the capacitor 154 and the transistor 152 including the oxide semiconductor film 134 are formed (see FIG. 9C). Such a transistor 152 has a characteristic of extremely low off-state current.

Through the above steps, the second semiconductor element layer 130 including the transistor 152 and the capacitor 154 can be formed. Thus, the semiconductor device including the first semiconductor element layer 110, the wiring layer 120, and the second semiconductor element layer 130 can be formed.

Note that before or after the above steps, a step for forming an additional electrode, wiring, semiconductor layer, insulating layer, or the like may be performed. For example, a multilayer wiring structure in which an insulating layer and a conductive layer are stacked is employed as a wiring structure, so that a highly-integrated semiconductor device can be provided.

In such a manner, the second semiconductor element layer including an oxide semiconductor is provided over the first semiconductor element layer including a material which is not an oxide semiconductor, such as single crystal silicon; thus, a semiconductor device having a novel structure in which a transistor including single crystal silicon or the like and a transistor including an oxide semiconductor are included in one integrated circuit can be provided.

Accordingly, with the use of a transistor including single crystal silicon or the like which can easily operate at high speed and a transistor including an oxide semiconductor which has an extremely low off-state current, a semiconductor device having a novel structure in which power consumption is reduced while high-speed operation is maintained can be provided.

Further, since the second semiconductor element layer including an oxide semiconductor is stacked over the first semiconductor element layer including a material which is not an oxide semiconductor, such as single crystal silicon, an increase in area occupied by the transistor including an oxide semiconductor material can be prevented. Thus, the semiconductor element having a novel structure can be highly integrated.

The capacitor can be formed without unnecessary steps in the process of forming the wiring layer and the transistor including an oxide semiconductor in the second semiconductor element layer, so that the semiconductor element and the capacitor can be efficiently formed.

The structures, methods, and the like described in this embodiment can be combined as appropriate with any of the structures, methods, and the like described in the other embodiments.

Embodiment 2

In this embodiment, a semiconductor device which is different from the semiconductor device described in Embodiment 1 and a method for manufacturing the semiconductor device will be described with reference to FIG. 10, FIGS. 11A to 11D, and FIGS. 12A and 12B.

<Structural Example of Semiconductor Device>

FIG. 10 is a cross-sectional view illustrating an example of a structure of a semiconductor device. A semiconductor device illustrated in FIG. 10 includes a transistor 150 in which includes a semiconductor formed using a first semiconductor material, a wiring 128a formed over the transistor 150, a transistor 166 formed over the transistor 150, and a capacitor 168 formed over the transistor 150. FIG. 10 illustrates a structure in which a first semiconductor element layer 110 including the transistor 150 formed using the first semiconductor material is provided in a lower portion, and part of the transistor 166 formed using a second semiconductor material and a second semiconductor element layer 170 including part of the capacitor 168 are provided in an upper portion. Further, the first semiconductor element layer 110 and the second semiconductor element layer 170 are electrically connected to each other through a wiring layer 120 provided therebetween. Although the semiconductor device illustrated in FIG. 10 includes one transistor 150, one transistor 166, and one capacitor 168, the semiconductor device may include a plurality of transistors 150, transistors 166, and capacitors 168.

Differences between the semiconductor device described in this embodiment and the semiconductor device described in the above embodiment are part of the wiring layer 120 and a structure of a second semiconductor element layer 170. Note that the structure of the first semiconductor element layer 110 is similar to that of the first semiconductor element layer 110 in the semiconductor device illustrated in FIG. 1; thus, the description in Embodiment 1 can be referred to for the details.

The wiring layer 120 formed over the first semiconductor element layer 110 includes an interlayer insulating film 122 formed over the interlayer insulating film 103, the wiring 114a, and the wiring 114b; an interlayer insulating film 124 formed over the interlayer insulating film 122; a connection electrode 126 formed so as to penetrate the interlayer insulating film 122 and to be embedded in the interlayer insulating film 124; and the wiring 128a, the electrode 128b, and a gate electrode 128c which are formed so as to be embedded in the interlayer insulating film 124 are formed. The wiring 128a, the electrode 128b, and the gate electrode 128c are provided so that the top surfaces are not covered with the interlayer insulating film 124, and are formed using the same conductive film. Here, the top surfaces of the interlayer insulating film 124, the wiring 128a, the electrode 128b, and the gate electrode 128c are preferably in substantially the same plane. The structures of the interlayer insulating film 122, the interlayer insulating film 124, the connection electrode 126, the wiring 128a, and the electrode 128b are similar to those in the semiconductor device illustrated in FIG. 1; thus, the description in Embodiment 1 can be referred to for the details.

The second semiconductor element layer 170 formed over the wiring layer 120 includes a gate insulating film 172 formed over the interlayer insulating film 124, the wiring 128a, the electrode 128b, and the gate electrode 128c; the transistor 166 including the gate insulating film 172; the protective insulating film 144 formed over the gate insulating film 172 and the transistor 166; the interlayer insulating film 146 formed over the protective insulating film 144; the connection electrode 148a formed so as to penetrate the gate insulating film 172 and the protective insulating film 144 and to be embedded in the interlayer insulating film 146; the connection electrode 148b formed so as to penetrate the protective insulating film 144 and to be embedded in the interlayer insulating film 146; and the wiring 149a and the wiring 149b formed so as to be embedded in the interlayer insulating film 146. The structures of the protective insulating film 144, the interlayer insulating film 146, the connection electrode 148a, the connection electrode 148b, the wiring 149a, and the wiring 149b are similar to those in the semiconductor device illustrated in FIG. 1; thus, the description in Embodiment 1 can be referred to for the details.

The transistor 166 includes the gate electrode 128c provided in the wiring layer 120; the gate insulating film 172 provided over the gate electrode 128c; an oxide semiconductor film 174 provided over the gate insulating film 172 to overlap with the gate electrode 128c; a channel protective film 176 formed over the oxide semiconductor film 174; and a source electrode (or a drain electrode) 182a and a drain electrode (or a source electrode) 182b which are formed in contact with at least part of the top surface of the oxide semiconductor film 174 through an opening formed in the channel protective film 176. Note that the oxide semiconductor film 174 can be similar to the oxide semiconductor film 134 described in Embodiment 1.

Further, the connection electrode 148b is provided in contact with the top surface of the source electrode 182a.

In addition, the capacitor 168 is formed using films in the second semiconductor element layer 170 and the wiring layer 120. The capacitor 168 includes the electrode 128b, the gate insulating film 172, and the drain electrode 182b. In other words, the electrode 128b functions as one electrode of the capacitor 168, the drain electrode 182b functions as the other electrode of the capacitor 168, the gate insulating film 172 functions as a dielectric of the capacitor 168. Here, an opening is formed in a region of the channel protective film 176 which overlaps with the electrode 128b. The drain electrode 182b is in contact with the gate insulating film 172 to overlap with the electrode 128b in the opening. Note that the channel protective film 176 is not necessarily provided with an opening in a region overlapping with the electrode 128b, in which case the channel protective film 176 also functions as a dielectric of the capacitor 168.

Here, the electrode 128b included in the capacitor 168 is formed using the same layer, the same material, and the same step as the wiring 128a. Further, the gate insulating film 172 and the drain electrode 182b which are included in the capacitor 168 are also included in the transistor 166. According to this, the capacitor 168 can be formed without unnecessary steps in the process of forming the wiring layer 120 and the transistor 166 in the second semiconductor element layer 170, so that the semiconductor element and the capacitor can be efficiently formed.

Note that although the transistor 166 is a "channel-stop transistor" in the semiconductor device described in this embodiment, the semiconductor device described in this embodiment is not limited thereto. For example, the transistor 166 can be a channel-etched transistor.

<Method for Manufacturing Semiconductor Device>

A method for manufacturing the semiconductor device illustrated in FIG. 10 will be described below with reference to FIGS. 11A to 11D and FIGS. 12A to 12C.

Note that methods for forming the first semiconductor element layer 110 and the wiring layer 120 are similar to those in Embodiment 1; thus, the descriptions in Embodiment 1 is to be referred to. Further, the gate electrode 128c in the wiring layer 120 can be formed at the same time as the electrode 128b.

<Method for Forming Second Semiconductor Element Layer>

A method for forming the second semiconductor element layer 170 will be described with reference to FIGS. 11A to 11D and FIGS. 12A to 12C.

First, the gate insulating film 172 is formed over the interlayer insulating film 124, the wiring 128a, the electrode 128b, and the gate electrode 128c.

The gate insulating film 172 is preferably an insulating film functioning as a barrier film which prevents entry of impurities diffused from under the gate insulating film 172 and is preferably an insulating film similar to the base insulating film 132a described in Embodiment 1. Further, a structure in which an insulating film containing excess oxygen is stacked over the insulating film functioning as a barrier film can be employed. In that case, an insulating film similar to the base insulating film 132b described in Embodiment 1 is stacked.

Here, the gate insulating film 172 is preferably subjected to polishing treatment (e.g., CMP treatment), dry etching treatment, plasma treatment, or the like to improve the surface flatness of the gate insulating film 172. Note that the description in Embodiment 1 can be referred to for the details of this step.

Figure 11A:
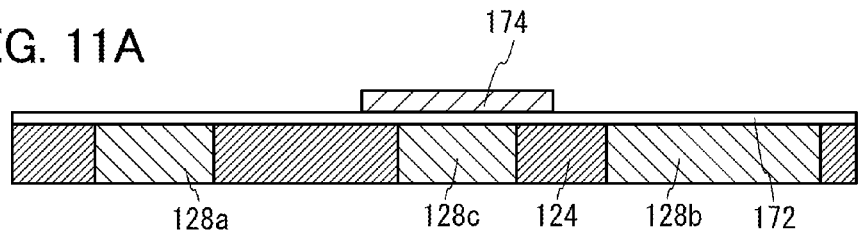
FIGS. 11A to 11D are cross-sectional views illustrating one embodiment of a method for manufacturing a semiconductor device.

Next, an oxide semiconductor film is formed over the gate insulating film 172 and the island-shaped oxide semiconductor film 174 is formed to overlap with the gate electrode 128c by a photolithography process (see FIG. 11A). Note that the description of the oxide semiconductor film 134 in Embodiment 1 can be referred to for the details of this step.

Figure 11B:
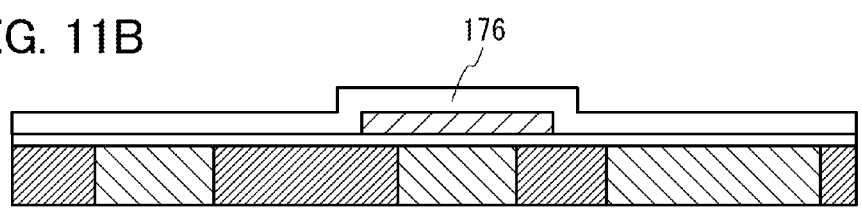

Then, the channel protective film 176 is formed over the oxide semiconductor film 174 and the gate insulating film 172 (see FIG. 11B). The channel protective film 176 is preferably an insulating film containing excess oxygen (insulating film containing oxygen in excess of that in the stoichiometric composition) because oxygen vacancy in the oxide semiconductor film 174 can be repaired by the excess oxygen contained in the channel protective film 176. Accordingly, an insulating film similar to the insulating film 136 described in Embodiment 1 is preferably used.

In addition, heat treatment may be performed after the formation of the channel protective film 176, so that the oxygen contained in the channel protective film 176, the amount of which exceeds that in the stoichiometric composition, can be supplied to the oxide semiconductor film 174. The heat treatment is preferably performed at higher than or equal to 250° C. and lower than or equal to 700° C., higher than or equal to 400° C. and lower than or equal to 700° C., or lower than the strain point of the substrate. The substrate is put in an electric furnace which is a kind of heat treatment apparatus and heat treatment is performed at 250° C. in a nitrogen atmosphere for 1 hour, for example.

Figure 11C:
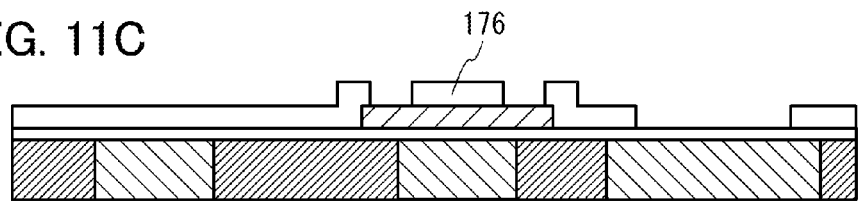
Figure 11D:
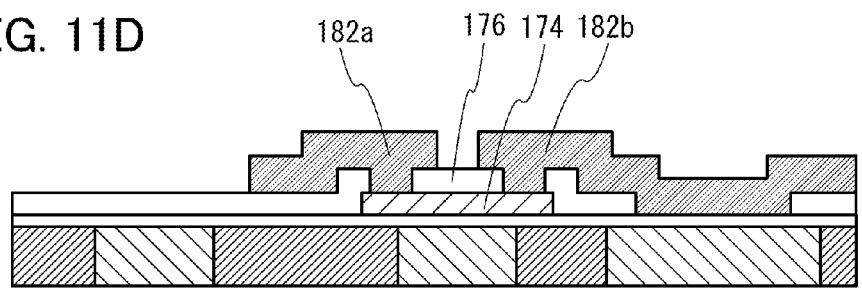

Next, by a photolithography process, a resist mask is formed over the channel protective film 176 and openings over the oxide semiconductor film 174 and an opening overlapping with the electrode 128b are formed (FIG. 11C). Note that either dry etching or wet etching, or both may be performed to etch the channel protective film 176.

The channel protective film 176 is provided on and in contact with the oxide semiconductor film 174 as described, whereby damage on the oxide semiconductor film 174 on the back channel side, which is caused by etching for the source electrode 182a and the drain electrode 182b (e.g., damage caused by plasma or an etchant in etching treatment), can be prevented. Accordingly, a semiconductor device including an oxide semiconductor and having stable electric characteristics can be provided.

Next, a conductive film used for the source electrode and the drain electrode is formed over the channel protective film 176 and the oxide semiconductor film 174. Then, the conductive film is selectively etched by a photolithography process, so that the source electrode 182a and the drain electrode 182b are formed (see FIG. 11D). Here, the source electrode 182a and the drain electrode 182b are provided in contact with the top surface of the oxide semiconductor film 174 through the openings formed in the channel protective film 176 in the above step. Further, the drain electrode 182b is provided in contact with the gate insulating film 172 in the opening formed in the channel protective film 176, so as to overlap with the electrode 128b.

This step can be performed in a manner similar to the step illustrated in FIG. 9A using a similar material; thus, the description with reference to FIG. 9A can be referred to for the details of the source electrode 182a and the drain electrode 182b.

Figure 12A:
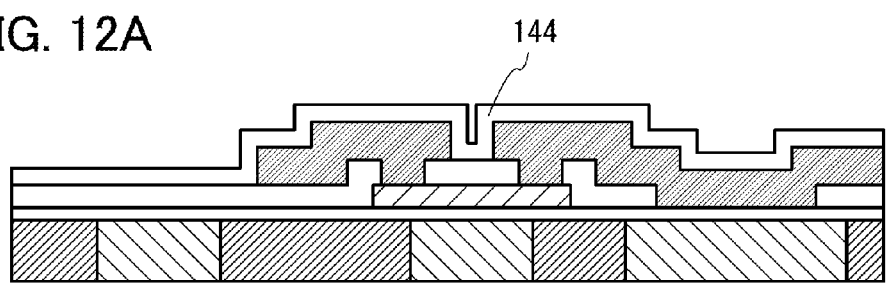
FIGS. 12A and 12B are cross-sectional views illustrating one embodiment of a method for manufacturing a semiconductor device.

Next, the protective insulating film 144 is formed over the channel protective film 176, the source electrode 182a, and the drain electrode 182b (see FIG. 12A). Here, the description in Embodiment 1 can be referred to for the details of the protective insulating film 144.

Then, the interlayer insulating film 146 is formed so as to cover the components formed in the above steps; an opening where the wiring 128a is exposed is formed in the interlayer insulating film 146, the protective insulating film 144, the channel protective film 176, and the gate insulating film 172; an opening where the source electrode 182a is exposed is formed in the interlayer insulating film 146 and the protective insulating film 144; and the connection electrode 148a and the wiring 149a, and the connection electrode 148b and the wiring 149b are formed to fill the openings. Note that the connection electrode 148a, the connection electrode 148b, the wiring 149a, and the wiring 149b, the descriptions in Embodiment 1 can be referred to for the details of the interlayer insulating film 146.

Figure 12B:
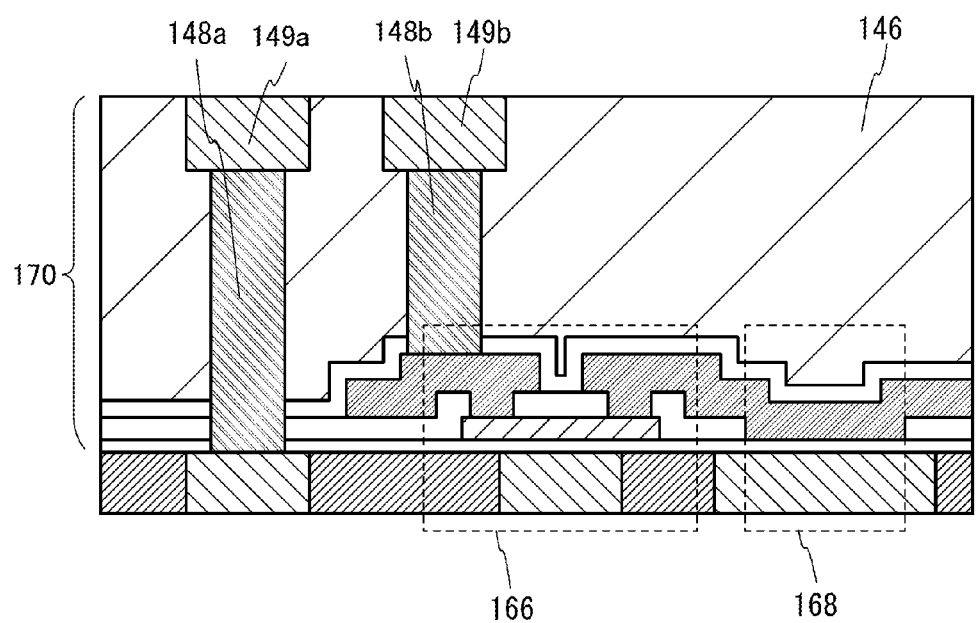

Thus, the capacitor 168 and the transistor 166 including the oxide semiconductor film 174 are formed (see FIG. 12B). Such a transistor 166 has a characteristic of extremely low off-state current.

Through the above steps, the second semiconductor element layer 170 including the transistor 166 and the capacitor 168 can be formed. Thus, the semiconductor device including the first semiconductor element layer 110, the wiring layer 120, and the second semiconductor element layer 170 can be formed.

In such a manner, the second semiconductor element layer including an oxide semiconductor is provided over the first semiconductor element layer including a material which is not an oxide semiconductor, such as single crystal silicon; thus, a semiconductor device having a novel structure in which a transistor including single crystal silicon or the like and a transistor including an oxide semiconductor are included in one integrated circuit can be provided.

Accordingly, with the use of a transistor including single crystal silicon or the like which can easily operate at high speed and a transistor including an oxide semiconductor which has an extremely low off-state current, a semiconductor device having a novel structure in which power consumption is reduced while high-speed operation is maintained can be provided.

Further, since the second semiconductor element layer including an oxide semiconductor is stacked over the first semiconductor element layer including a material which is not an oxide semiconductor, such as single crystal silicon, an increase in area occupied by the transistor including an oxide semiconductor material can be prevented. Thus, the semiconductor element having a novel structure can be highly integrated.

Furthermore, the capacitor can be formed without unnecessary steps in the process of forming the wiring layer and the transistor including an oxide semiconductor in the second semiconductor element layer, so that the semiconductor element and the capacitor can be efficiently formed.

The structures, methods, and the like described in this embodiment can be combined as appropriate with any of the structures, methods, and the like described in the other embodiments.

Embodiment 3

In this embodiment, the semiconductor device described in the above embodiment which can hold stored data even when power is not supplied and does not have a limitation on the number of write cycles will be described with reference to FIGS. 13A and 13B.

Figure 13A:
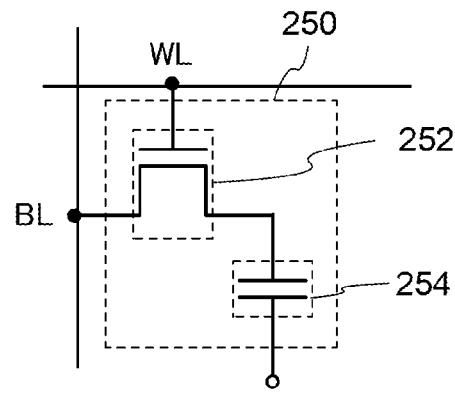
FIG. 13A is a circuit diagram and FIG. 13B is a perspective view each of which illustrates one embodiment of a semiconductor device.
Figure 13B:
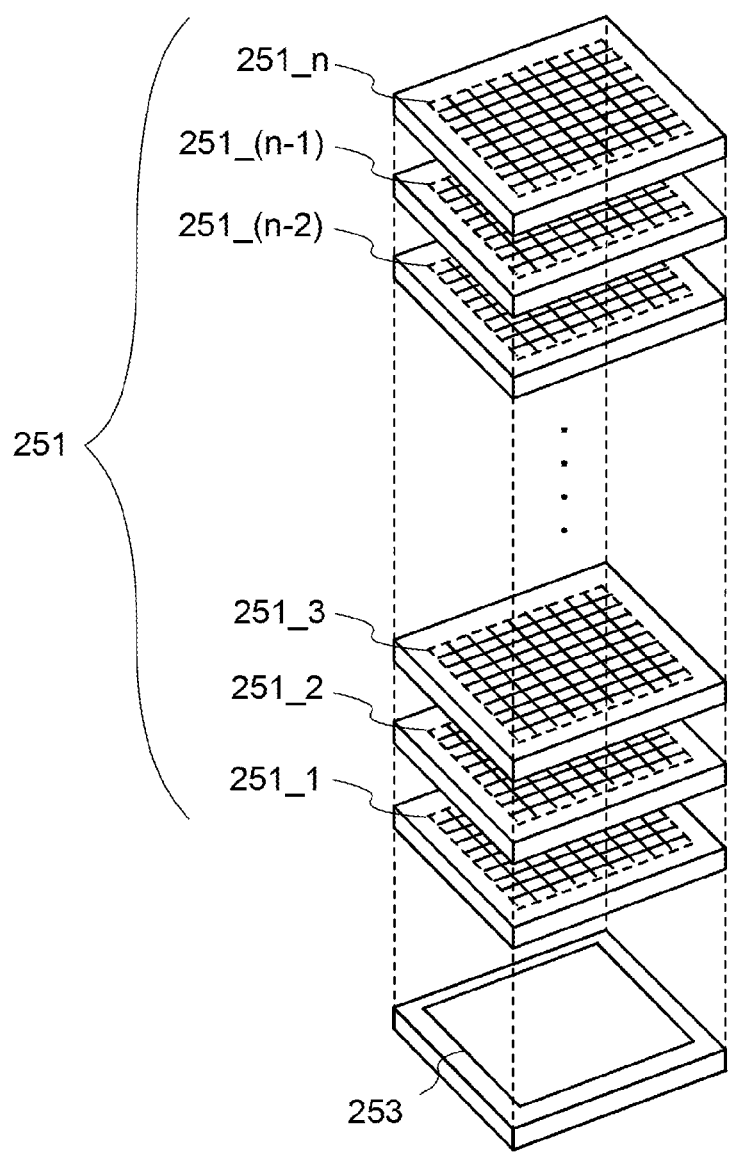

FIG. 13A illustrates an example of a circuit configuration of a semiconductor device, and FIG. 13B is a conceptual diagram illustrating an example of a semiconductor device. First, the semiconductor device illustrated in FIG. 13A will be described, and then, the semiconductor device illustrated in FIG. 13B will be described.

In the semiconductor device illustrated in FIG. 13A, a bit line BL is electrically connected to a source electrode or a drain electrode of a transistor 252, a word line WL is electrically connected to the gate electrode of the transistor 252, and the source electrode or the drain electrode of the transistor 252 is electrically connected to a first terminal of a capacitor 254. Here, the transistor 252 is formed using an oxide semiconductor material.

Next, writing and holding of data in the semiconductor device (memory cell 250) illustrated in FIG. 13A will be described.

First, the potential of the word line WL is set to a potential at which the transistor 252 is turned on, so that the transistor 252 is turned on. Accordingly, the potential of the bit line BL is supplied to the first terminal of the capacitor 254 (writing). After that, the potential of the word line WL is set to a potential at which the transistor 252 is turned off, so that the transistor 252 is turned off. Thus, the potential of the first terminal of the capacitor 254 is held (holding).

Off current is extremely small in the transistor 252 formed using an oxide semiconductor. For that reason, the potential of the first terminal of the capacitor 254 (or a charge accumulated in the capacitor 254) can be held for an extremely long period by turning off the transistor 252.

Then, reading of data is described. When the transistor 252 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL obtained after charge redistribution is $(C_B*V_{B0}+C*V)/(C_B+C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL obtained before the charge redistribution. Thus, it can be found that the potential of the bit line BL, in the case of holding the potential $V_1$, $(=(C_B*V_{B0}+C*V_1)/(C_B+C))$ is higher than the potential of the bit line BL, in the case of holding the potential $V_0$, $(=(C_B*V_{B0}+C*V_0)/(C_B+C))$ assuming that the memory cell 250 is in either of two states in which the potentials of the first terminal of the capacitor 254 are $V_1$ and $V_0$ ($V_1$>$V_0$).

Then, by comparing the potential of the bit line BL with a predetermined potential, data can be read.

As described above, the semiconductor device illustrated in FIG. 13A can hold charge that is accumulated in the capacitor 254 for a long time because the off-state current of the transistor 252 is extremely small. In other words, power consumption can be adequately reduced because refresh operation becomes unnecessary or the frequency of refresh operation can be extremely low. Moreover, stored data can be held for a long time even when power is not supplied.

Next, the semiconductor device illustrated in FIG. 13B will be described.

The semiconductor device illustrated in FIG. 13B includes a memory cell array 251_1 to a memory cell array 251_n (n is an integer of 2 or more) including a plurality of memory cells 250 illustrated in FIG. 13A as memory circuits in an upper portion, and a peripheral circuit 253 in a lower portion which is necessary for operating memory cell arrays 251 (the memory cell array 251_1 to the memory cell array 251_n). Note that the peripheral circuit 253 is electrically connected to the memory cell arrays 251.

In the structure illustrated in FIG. 13B, the peripheral circuit 253 can be provided directly under the memory cell arrays 251 (the memory cell array 251_1 to the memory cell array 251_n). Thus, the size of the semiconductor device can be decreased.

It is preferable that a semiconductor material of a transistor provided in the peripheral circuit 253 is different from that of the transistor 252. For example, silicon, germanium, silicon germanium, silicon carbide, gallium arsenide, or the like can be used, and a single crystal semiconductor is preferably used. Alternatively, an organic semiconductor material or the like may be used. A transistor formed using such a semiconductor material can operate at sufficiently high speed. Thus, a variety of circuits (e.g., a logic circuit and a driver circuit) which need to operate at high speed can be favorably achieved by using the transistor.

The semiconductor device illustrated in FIG. 1 can be taken as an example of a specific structure of the semiconductor device illustrated in FIG. 13B. That is, the first semiconductor element layer 110 illustrated in FIG. 1 is used for the peripheral circuit 253 illustrated in FIG. 13B and the second semiconductor element layer 130 illustrated in FIG. 1 can be used for each of the memory cell arrays 251_1 to 251_n illustrated in FIG. 13B. The second semiconductor element layer 130 and the wiring layer 120 can be stacked as appropriate depending on the number of layers of the memory cell arrays.

Here, the transistor 152 and the capacitor 154 illustrated in FIG. 1 can be used as the transistor 252 and the capacitor 254 in the memory cell 250 illustrated in FIG. 13A, respectively. Thus, the gate electrode 138a, the source electrode 142a, and the drain electrode 142b illustrated in FIG. 1 can be used as the gate electrode, the source electrode, and the drain electrode of the transistor 252 illustrated in FIG. 13A, respectively. Further, the wiring 149b and a wiring connected to the gate electrode 138a can be used as the bit line BL illustrated in FIG. 13A and the word line WL illustrated in FIG. 13A, respectively.

Note that although the specific structure of the semiconductor device illustrated in FIG. 13B is described taking the semiconductor device illustrated in FIG. 1 as an example in this embodiment, the structures of the other semiconductor devices described in Embodiment 1 and Embodiment 2 can also be used as appropriate.

A semiconductor device having a novel feature can be obtained by being provided with both a peripheral circuit including the transistor including a material which is not an oxide semiconductor (in other words, a transistor capable of operating at sufficiently high speed) and a memory circuit including the transistor including an oxide semiconductor (in a broader sense, a transistor whose off-state current is sufficiently small). In addition, the use of a structure where the peripheral circuit and the memory circuit are stacked leads to an increase in the degree of integration of the semiconductor device.

Through the above steps, with the use of a transistor including single crystal silicon or the like which can easily operate at high speed and a transistor including an oxide semiconductor which has an extremely low off-state current, a semiconductor device in which high-speed operation is maintained and power consumption is reduced can be provided.

In the semiconductor device, the capacitor can be formed without unnecessary steps in the process of forming the wiring layer and the transistor including an oxide semiconductor in the second semiconductor element layer, so that the semiconductor element and the capacitor can be efficiently formed.

This embodiment can be implemented in appropriate combination with any of the structures described in the other embodiments.

Embodiment 4

In this embodiment, an example of the semiconductor device described in the above embodiment, which can hold stored data even when not powered, which does not have a limitation on the number of write cycles, and which is different from that described in Embodiment 3 will be described with reference to FIG. 14 and FIG. 15.

Figure 14:
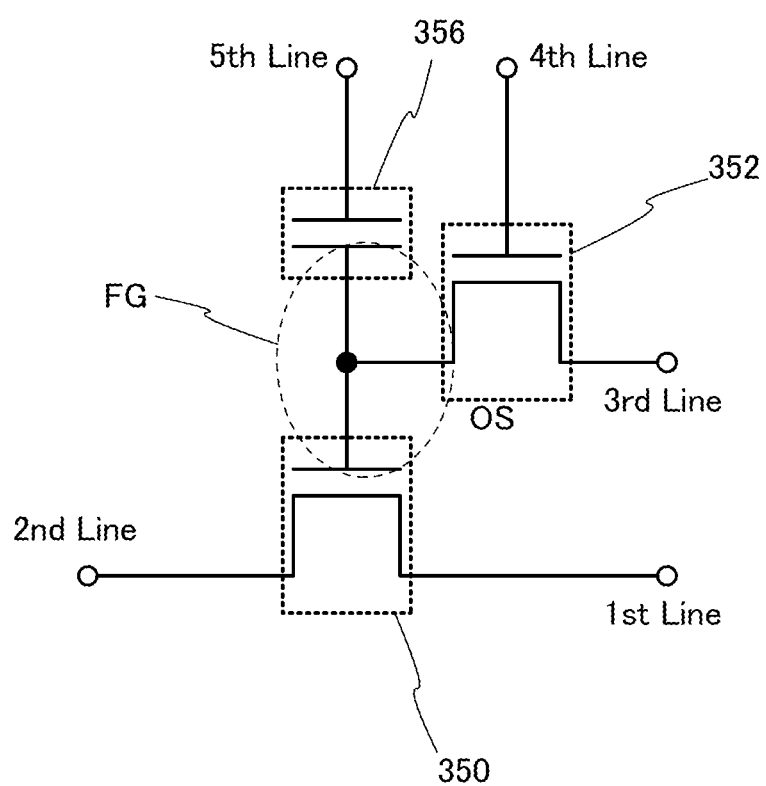
FIG. 14 is a circuit diagram illustrating one embodiment of a semiconductor device.

FIG. 14 illustrates an example of a circuit configuration of a semiconductor device described in this embodiment.

In FIG. 14, a first wiring (1st line) is electrically connected to the source electrode of the transistor 350. A second wiring (2nd line) is electrically connected to the drain electrode of the transistor 350. A third wiring (3rd line) is electrically connected to one of the source electrode and the drain electrode of the transistor 352, and a fourth wiring (4th line) is electrically connected to the gate electrode of the transistor 352. The gate electrode of the transistor 350 and the other of the source electrode and the drain electrode of the transistor 352 are electrically connected to one electrode of the capacitor 356 to form a node FG. A fifth wiring (5th line) is electrically connected to the other electrode of the capacitor 356. Here, the transistor 350 is formed using a semiconductor material which is not an oxide semiconductor, such as single crystal silicon, and the transistor 352 is formed using an oxide semiconductor material.

The semiconductor device in FIG. 14 utilizes a characteristic in which the potential of the gate electrode of the transistor 350 can be held, and thus enables writing, holding, and reading of data as follows.

Writing and holding of data is described. First, the potential of the fourth wiring is set to a potential at which the transistor 352 is turned on, so that the transistor 352 is turned on. Accordingly, the potential of the third wiring is supplied to the gate electrode of the transistor 350 and the capacitor 356. That is, predetermined charge is given to the gate electrode of the transistor 350 (writing). Here, charge for supplying either of two different potential levels (hereinafter referred to as low-level charge and high-level charge) is given. After that, the potential of the fourth wiring is set to a potential at which the transistor 352 is turned off, so that the transistor 352 is turned off. Thus, the charge given to the gate electrode of the transistor 350 is held (holding).

Since the off-state current of the transistor 352 including an oxide semiconductor is extremely low, the charge of the gate electrode of the transistor 350 (node FG) is held for a long time.

Next, reading of data is described. By supplying an appropriate potential (reading potential) to the fifth wiring while a predetermined potential (constant potential) is supplied to the first wiring, the potential of the second wiring varies depending on the amount of charge held in the gate electrode of the transistor 350. This is because in general, when the transistor 350 is an n-channel transistor, an apparent threshold voltage $V_{th\_H}$ in the case where the high-level charge is given to the gate electrode of the transistor 350 is lower than an apparent threshold voltage $V_{th\_L}$ in the case where the low-level charge is given to the gate electrode of the transistor 350. Here, an apparent threshold voltage refers to the potential of the fifth wiring, which is needed to turn on the transistor 350. Thus, the potential of the fifth wiring is set to a potential $V_0$ that is between $V_{th\_H}$ and $V_{th\_L}$, whereby charge given to the gate electrode of the transistor 350 can be determined. For example, in the case where the high-level charge is given in writing, when the potential of the fifth wiring is set to $V_0$ ($>V_{th\_H}$), the transistor 350 is turned on. In the case where the low-level charge is given in writing, even when the potential of the fifth wiring is set to $V_0$ ($<V_{th\_L}$), the transistor 350 remains in an off state. Accordingly, the data held can be read by the potential of the second wiring.

The transistor 350 formed using a semiconductor material which is not an oxide semiconductor, such as single crystal silicon, can operate at sufficiently high speed; thus, the speed of data reading can be increased.

Note that in the case where memory cells are arrayed to be used, only data of desired memory cells needs to be read. In the case where such reading is not performed, a potential at which the transistor 350 is turned off regardless of the state of the gate electrode of the transistor 350, that is, a potential lower than $V_{th\_H}$ may be given to the fifth wiring. Alternatively, a potential which allows the transistor 350 to be turned on regardless of a state of the gate electrode, that is, a potential higher than $V_{th\_L}$ may be given to the fifth wiring.

When a transistor having a channel formation region formed using an oxide semiconductor and having extremely small off-state current is applied to the semiconductor device in this embodiment, the semiconductor device can held stored data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating film does not occur at all. In other words, the semiconductor device of one embodiment of the disclosed invention does not have a limit on the number of times of writing which is a problem in a conventional non-volatile memory, and reliability thereof is drastically improved. Furthermore, data is written depending on the on state and the off state of the transistor, whereby high-speed operation can be easily realized.

Next, a specific structure of the semiconductor device illustrated in FIG. 14 is described with reference to a cross-sectional view illustrated in FIG. 15. A semiconductor device illustrated in FIG. 15 includes a first semiconductor element layer 310 including the transistor 350 formed using a semiconductor material which is not an oxide semiconductor, such as single crystal silicon, in a lower portion; and a second semiconductor element layer 330 including the transistor 352 formed using an oxide semiconductor material and part of the capacitor 356, in an upper portion. Further, the first semiconductor element layer 310 and the second semiconductor element layer 330 are electrically connected to each other through a wiring layer 320 provided therebetween. Here, structures of the transistor 350, the transistor 352, and the capacitor 356 are similar to the structures of the transistor 150, the transistor 152, and the capacitor 156 in the semiconductor device illustrated in FIG. 2, respectively.

Figure 15:
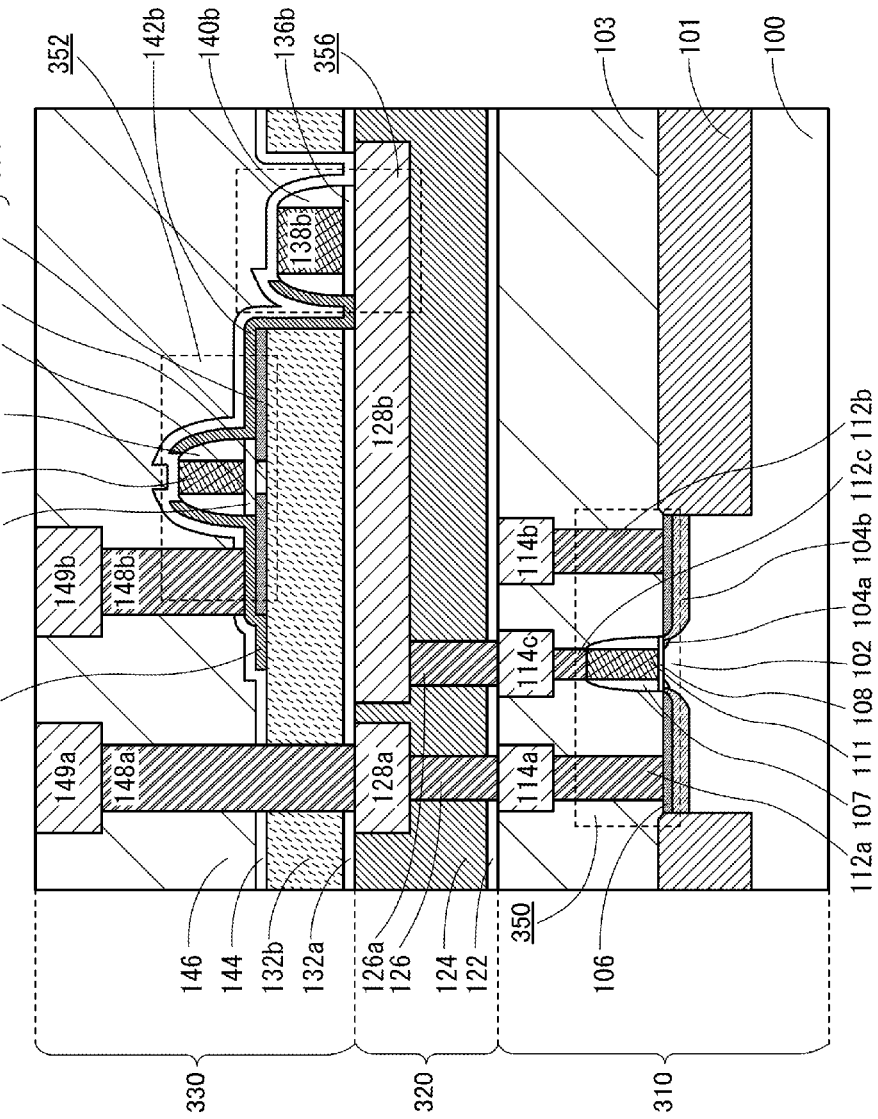
FIG. 15 is a cross-sectional view illustrating one embodiment of a semiconductor device.

The semiconductor device illustrated in FIG. 15 is different from the semiconductor device illustrated in FIG. 2 in that a connection electrode 112c, a wiring 114c, and the connection electrode 126a are provided and through these electrodes, the gate electrode 111 of the transistor 350, the electrode 128b of the capacitor 356, and the drain electrode 142b of the transistor 352 are connected to each other. Here, the connection electrode 112c, the connection electrode 112a, and the connection electrode 112b are formed using the same film and the connection electrode 112c has a structure similar to that of the connection electrode 112a and the connection electrode 112b. The wiring 114c, the wiring 114a, and the wiring 114b are formed using the same film and the wiring 114c has a structure similar to that of the wiring 114a and the wiring 114b. The connection electrode 126a and the connection electrode 126 are formed using the same film and the connection electrode 126a has a structure similar to that of the connection electrode 126. Note that the other components of the semiconductor device illustrated in FIG. 15 are similar to those of the semiconductor device illustrated in FIG. 2 and thus are denoted by the same reference numerals as those shown in FIG. 2, and the above-described embodiments can be referred to for the details.

Here, the wiring 114b, the wiring 149a, the wiring 149b, a wiring connected to the gate electrode 138a, and a wiring connected to the electrode 138b can be used as the first wiring (1st Line), the second wiring (2nd Line), the third wiring (3rd Line), the fourth wiring (4th Line), and the fifth wiring (5th Line), respectively. Further, the node FG corresponds to the gate electrode 111, the connection electrode 112c, the wiring 114c, the connection electrode 126a, the electrode 128b, and the drain electrode 142b.

Note that although the specific structure of the semiconductor device illustrated in FIG. 14 is described taking the semiconductor device illustrated in FIG. 15 as an example in this embodiment, the structures of the semiconductor devices described in Embodiment 1 and Embodiment 2 can also be used as appropriate.

In such a manner, the second semiconductor element layer including an oxide semiconductor is provided over the first semiconductor element layer including a material which is not an oxide semiconductor, such as single crystal silicon; thus, a semiconductor device having a novel structure in which a transistor including single crystal silicon or the like and a transistor including an oxide semiconductor are included in one integrated circuit can be provided.

Accordingly, with the use of a transistor including single crystal silicon or the like which can easily operate at high speed and a transistor including an oxide semiconductor which has an extremely low off-state current, a semiconductor device having a novel structure in which high-speed operation is maintained and power consumption is reduced can be provided.

Further, since the second semiconductor element layer including an oxide semiconductor is stacked over the first semiconductor element layer including a material which is not an oxide semiconductor, such as single crystal silicon, an increase in area occupied by the transistor including an oxide semiconductor material can be prevented. Thus, the semiconductor element having a novel structure can be highly integrated.

In the semiconductor device, the capacitor can be formed without unnecessary steps in the process of forming the wiring layer and the transistor including an oxide semiconductor in the second semiconductor element layer, so that the semiconductor element and the capacitor can be efficiently formed.

The structures, methods, and the like described in this embodiment can be combined as appropriate with any of the structures, methods, and the like described in the other embodiments.

Embodiment 5

A central processing unit (CPU) can be formed with the use of the semiconductor device described in the above embodiment for at least part of the CPU.

Figure 16A:
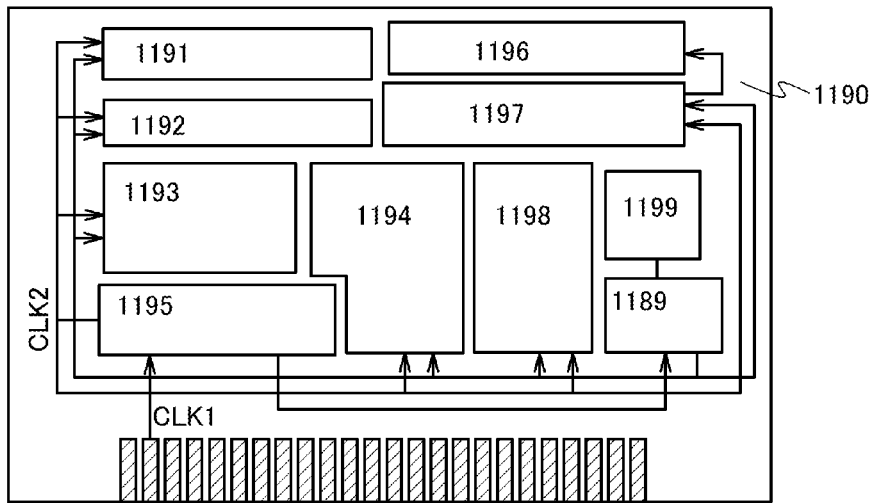
FIGS. 16A to 16C each illustrate an example of a structure of a semiconductor device.

FIG. 16A is a block diagram illustrating a specific structure of the CPU. The CPU illustrated in FIG. 16A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may each be provided over a separate chip. Obviously, the CPU shown in FIG. 16A is just an example in which the configuration has been simplified, and an actual CPU may have a variety of configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct a variety of controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and process the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 16A, a memory cell is provided in the register 1196. As the memory cell of the register 1196, a memory cell including the semiconductor device described in the above embodiment can be used.

In the CPU illustrated in FIG. 16A, the register controller 1197 selects an operation of holding data in the register 1196 in accordance with an instruction from the ALU 1191. That is, the register controller 1197 selects whether data is held by a logic element which inverts a logic (value) or a capacitor in the memory cell included in the register 1196. When data holding by the logic element which inverts a logic (value) is selected, power supply voltage is supplied to the memory cell in the register 1196. When data holding by the capacitor is selected, the data is rewritten in the capacitor, and supply of power supply voltage to the memory cell in the register 1196 can be stopped.

Figure 16B:
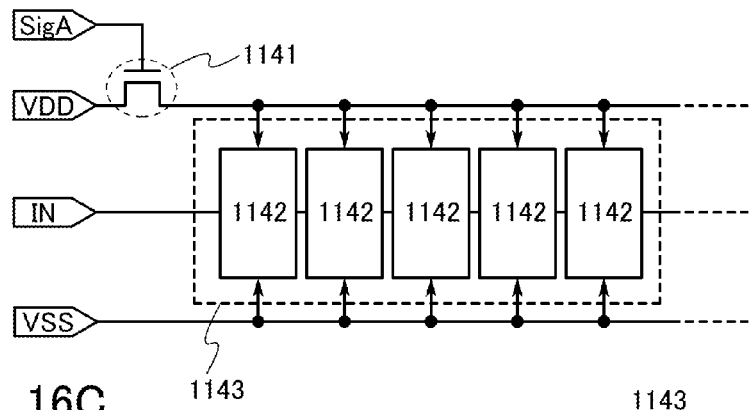
Figure 16C:
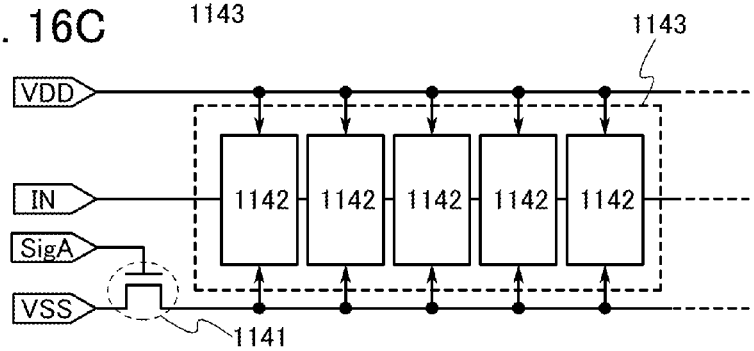

The power supply can be stopped by providing a switching element between a memory cell group and a node to which a power supply potential VDD or a power supply potential VSS is supplied, as illustrated in FIG. 16B or FIG. 16C. Circuits illustrated in FIGS. 16B and 16C are described below.

FIGS. 16B and 16C each illustrate an example of a structure of a memory circuit in which the transistor formed using an oxide semiconductor material of the second semiconductor element layer described in the above embodiment is used as a switching element for controlling supply of a power supply potential to a memory cell.

The memory device illustrated in FIG. 16B includes a switching element 1141 and a memory cell group 1143 including a plurality of memory cells 1142. Specifically, as each of the memory cells 1142, the memory cell described in the above embodiment can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 16B, any of the transistor formed using an oxide semiconductor material of the second semiconductor element layer described in the above embodiment is used as the switching element 1141, and the switching of the transistor is controlled by a signal Sig A supplied to a gate electrode thereof.

Note that FIG. 16B illustrates the structure in which the switching element 1141 includes only one transistor; however, without particular limitation thereon, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 16B, the switching element 1141 may control the supply of the low-level power supply potential VSS.

In FIG. 16C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

The CPU described in this embodiment includes the semiconductor device described in the above embodiment, in which the second semiconductor element layer including an oxide semiconductor is provided over the first semiconductor element layer including a semiconductor material which is not an oxide semiconductor, such as single crystal silicon. Accordingly, a transistor including single crystal silicon or the like which can easily operate at high speed and a transistor including an oxide semiconductor which has an extremely low off-state current can be used as appropriate according to the function of a transistor included in the CPU. Thus, a CPU in which power consumption is reduced while high-speed operation is maintained can be provided.

Further, since the second semiconductor element layer including an oxide semiconductor is stacked over the first semiconductor element layer including a semiconductor material which is not an oxide semiconductor, such as single crystal silicon, an increase in area occupied by the transistor including an oxide semiconductor material can be prevented. Thus, the CPU can be highly integrated.

Furthermore, the capacitor can be formed without unnecessary steps in the process of forming a wiring layer and the transistor including an oxide semiconductor in the second semiconductor element layer, so that the semiconductor element included in the CPU and the capacitor can be efficiently formed.

Although the CPU is given as an example, the transistor can also be applied to an LSI such as a digital signal processor (DSP), a custom LSI, or a field programmable gate array (FPGA).

A magnetic tunnel junction element (MTJ element) is known as a nonvolatile random access memory. The MTJ element is an element for storing data in a low resistance state when the magnetization directions of ferromagnetic films which are formed with an insulating film provided therebetween are parallel and storing data in a high-resistance state when the directions thereof are anti parallel. Thus, its operation principle is quite different from that of a memory including an oxide semiconductor described in this embodiment. Table 1 shows comparison between the MTJ element and the semiconductor device according to this embodiment.

TABLE 1

| | | Spintronics (MTJ element) | OS/Si |
|---|---|---|---|
| 1) | Heat Resistance | Curie temperature | Process temperature at 500° C. (reliability at 150° C.) |
| 2) | Driving Method | Current driving | Voltage driving |
| 3) | Writing Principle | Changing magnetization direction of ferromagnetic film | Turning on/off FET |
| 4) | Si LSI | Suitable for bipolar LSI (For highly integrated circuit, MOS LSI is preferable to bipolar LSI, which is unsuitable for high integration. Note that W becomes larger.) | Suitable for MOS LSI |
| 5) | Overhead | Large (because of high Joule heat) | Smaller than overhead of MTJ element by 2 to 3 or more orders of magnitude (because of charging and discharging of parasitic capacitance) |
| 6) | Non-volatility | Utilizing spin | Utilizing small off-state current |
| 7) | Read Cycles | No limitation | No limitation |
| 8) | 3D Structure | Difficult (at most two layers) | Easy (with a limitless number of layers) |
| 9) | Integration Degree ($F^2$) | 4 $F^2$ to 15 $F^2$ | Depending on the number of layers stacked in 3D structure (need heat resistance high enough to withstand process of forming upper OS FET) |
| 10) | Material | Magnetic rare-earth element | OS material |
| 11) | Cost per Bit | High | Low (might be slightly high depending on constituent of OS (e.g., In)) |
| 12) | Resistance to Magnetic Field | Low | High |

The MTJ element has a disadvantage in that, because a magnetic material is used, a magnetic property is lost when the temperature is higher than or equal to the Curie temperature. In addition, the MTJ element is compatible with a silicon bipolar device because current driving is employed; however, the bipolar device is unsuitable for high integration. Further, there is a problem in that power consumption is increased by an increase in memory capacity, though the writing current of the MTJ element is extremely small.

In principle, the MTJ element has low resistance to a magnetic field, and the magnetization direction is easily changed when the MTJ element is exposed to a high magnetic field. In addition, it is necessary to control magnetic fluctuation which is caused by nanoscaling of a magnetic material used for the MTJ element.

In addition, a rare earth element is used as the MTJ element; thus, it requires special attention to incorporate a process of forming the MTJ element in a process of forming a silicon semiconductor that is sensitive to metal contamination. The material cost per bit of the MTJ element is expensive.

On the other hand, the transistor including an oxide semiconductor material of the second semiconductor element layer, which is described in the above embodiment, has an element structure and an operation principle similar to those of a silicon MOSFET except that a semiconductor material for forming a channel is a metal oxide. Further, the transistor including an oxide semiconductor is not affected by a magnetic field, and does not cause soft errors. This shows that the transistor is highly compatible with a silicon integrated circuit.

As shown in Table 1, the memory in which the transistor including an oxide semiconductor and the transistor including silicon are combined, which is described in the above embodiment, has advantages over a spintronics device in many aspects such as the heat resistance, the three-dimensional structure (stacked-layer structure of three or more layers), and the resistance to a magnetic field. Note that the power for overhead shown in Table 1 is, for example, power for writing data into a memory portion or the like in a processor, which is what is called power consumed for overhead.

As described above, the use of the memory including an oxide semiconductor, which has more advantages than the spintronics device makes it possible to reduce power consumption of a CPU.

The structures, methods, and the like described in this embodiment can be combined as appropriate with any of the structures, methods, and the like described in the other embodiments.

Embodiment 6

In this embodiment, examples of application of the semiconductor device described in any of the above embodiments to portable devices such as mobile phones, smartphones, and e-book readers will be described with reference to FIGS. 17A and 17B, FIG. 18, FIG. 19, and FIG. 20.

In portable electronic devices such as mobile phones, smartphones, and e-book readers, an SRAM or a DRAM is used to store image data temporarily. This is because response speed of a flash memory is low and thus a flash memory is not suitable for image processing. On the other hand, an SRAM or a DRAM has the following characteristics when used for temporary storage of image data.

Figure 17A:
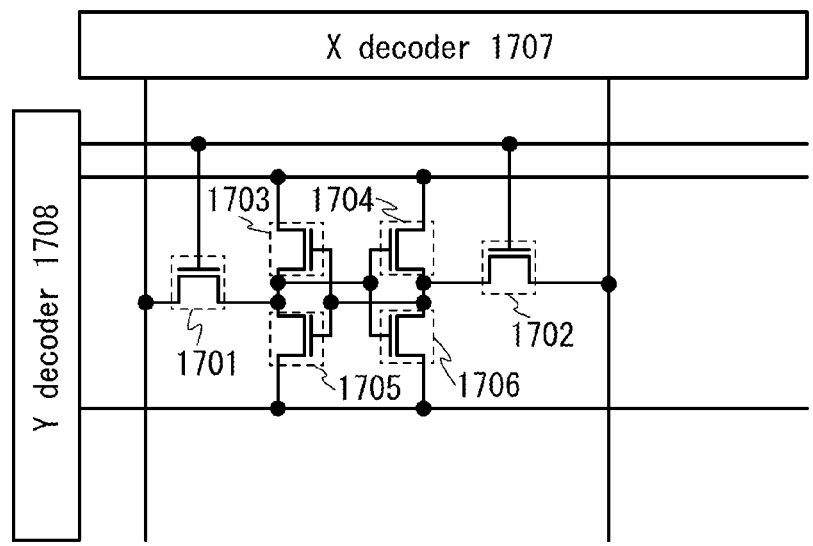
FIGS. 17A and 17B each illustrate an example of a structure of a semiconductor device.

In a normal SRAM, as illustrated in FIG. 17A, one memory cell includes six transistors, which are transistors 1701 to 1706, and they are driven by an X decoder 1707 and a Y decoder 1708. The transistors 1703 and 1705 and the transistors 1704 and 1706 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Thus, a price per bit of an SRAM is the most expensive among a variety of memory devices.

Figure 17B:
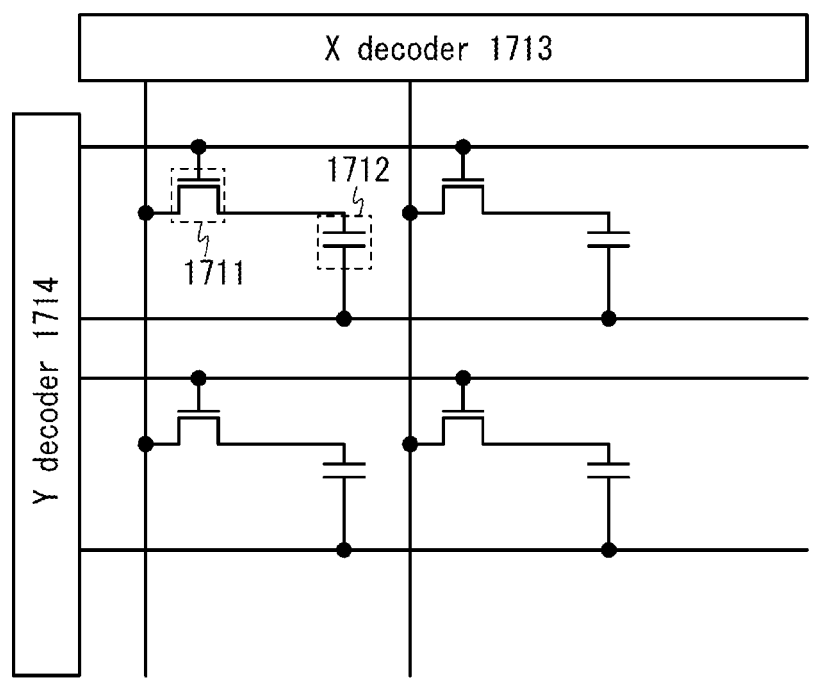

On the other hand, as illustrated in FIG. 17B, a memory cell in a DRAM includes a transistor 1711 and a storage capacitor 1712, and is driven by an X decoder 1713 and a Y decoder 1714. One cell includes one transistor and one capacitor and thus the area of a memory cell is small. The area of a memory cell of a DRAM is generally less than or equal to 10 $F^2$. Note that in the case of a DRAM, a refresh operation is always necessary and power is consumed even when a rewriting operation is not performed.

However, the area of the memory cell of the semiconductor device described the above embodiments is about 10 $F^2$ and frequent refreshing is not needed. Thus, the area of the memory cell is reduced, and the power consumption can be reduced.

Figure 18:
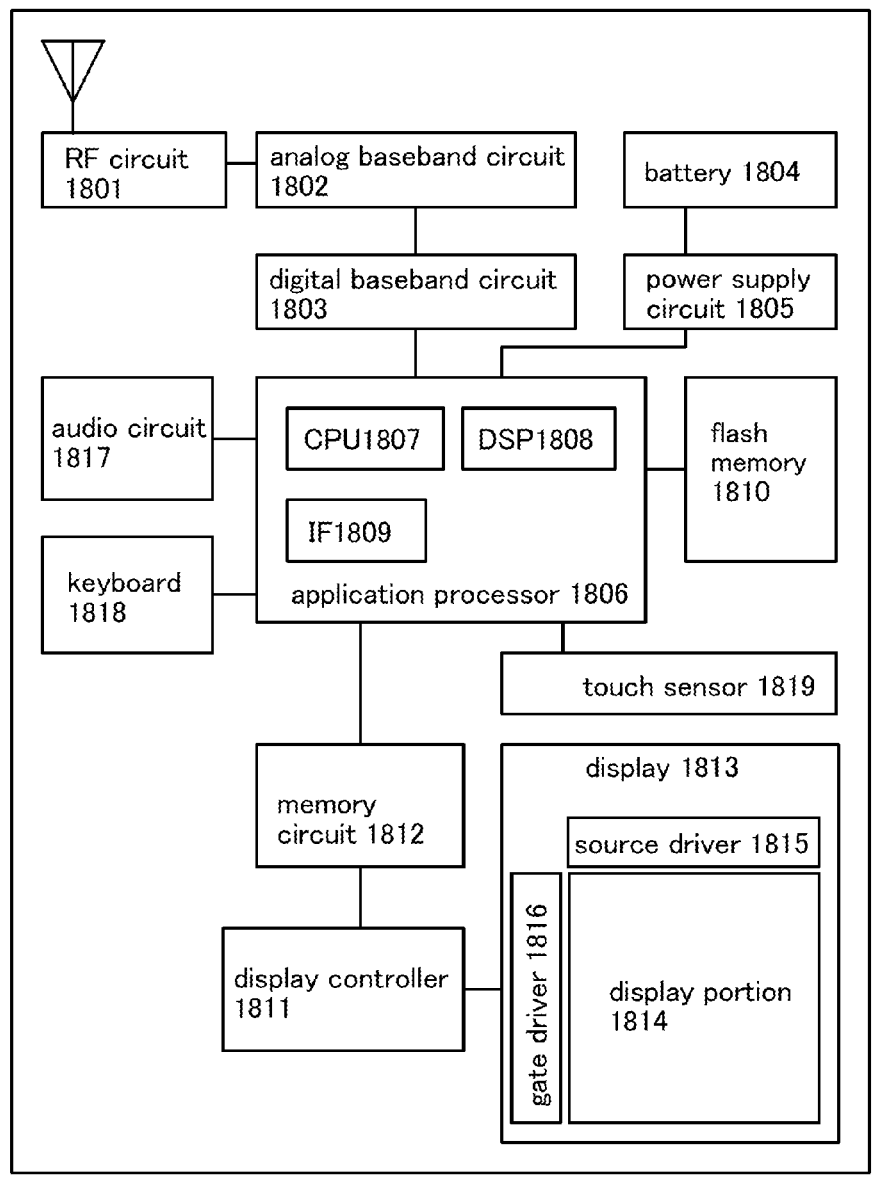
FIG. 18 illustrates an example of a structure of a semiconductor device.

Next, a block diagram of a portable device is illustrated in FIG. 18. A portable device illustrated in FIG. 18 includes an RF circuit 1801, an analog baseband circuit 1802, a digital baseband circuit 1803, a battery 1804, a power supply circuit 1805, an application processor 1806, a flash memory 1810, a display controller 1811, a memory circuit 1812, a display 1813, a touch sensor 1819, an audio circuit 1817, a keyboard 1818, and the like. The display 1813 includes a display portion 1814, a source driver 1815, and a gate driver 1816. The application processor 1806 includes a CPU 1807, a DSP 1808, and an interface 1809 (also referred to as IF). In general, the memory circuit 1812 includes an SRAM or a DRAM; by employing the semiconductor device described in any of the above embodiments for the memory circuit 1812, writing and reading of data can be performed at high speed, data can be held for a long time, and power consumption can be sufficiently reduced.

Figure 19:
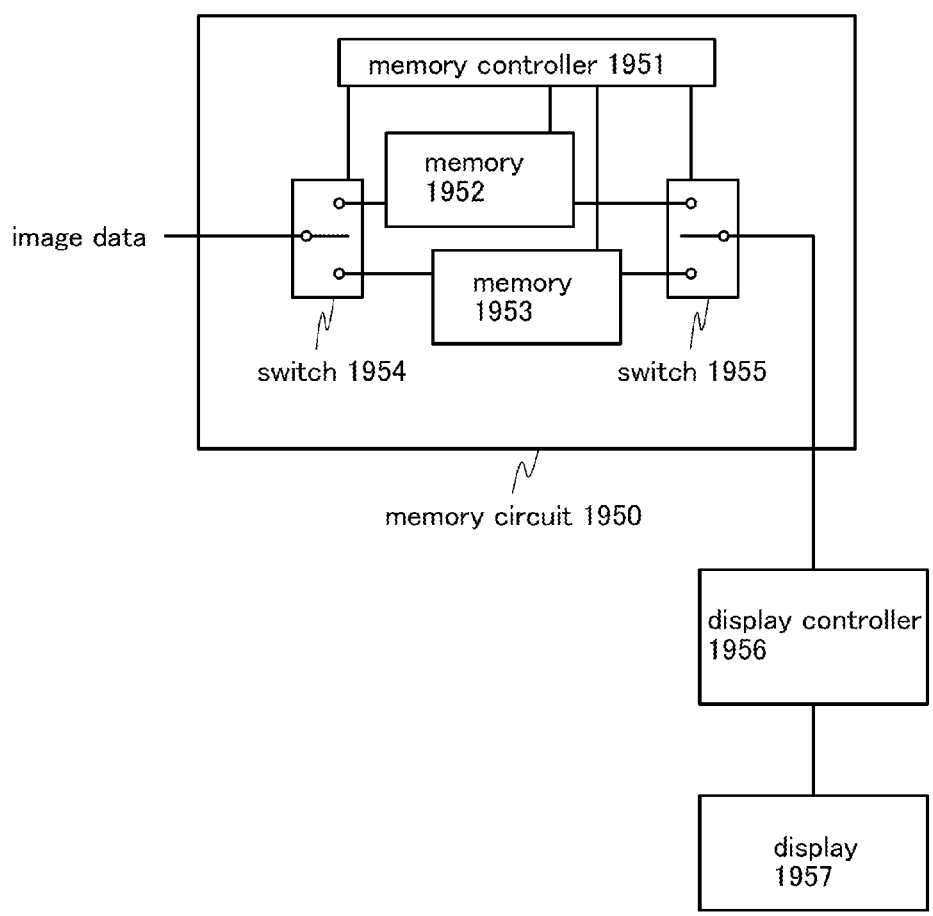
FIG. 19 illustrates an example of a structure of a semiconductor device.

Next, FIG. 19 shows an example in which the semiconductor device described in any of the above embodiments is used for a memory circuit 1950 in a display. The memory circuit 1950 illustrated in FIG. 19 includes a memory 1952, a memory 1953, a switch 1954, a switch 1955, and a memory controller 1951. Further, the memory circuit 1950 is connected to a display controller 1956 which reads and controls image data input through a signal line (input image data) and data stored in the memories 1952 and 1953 (stored image data). The display controller 1956 is connected to a display 1957.

First, image data (input image data A) is formed by an application processor (not shown). The input image data A is stored in the memory 1952 though the switch 1954. The image data (stored image data A) held in the memory 1952 is transmitted and displayed to the display 1957 through the switch 1955 and the display controller 1956.

In the case where the input image data A is not changed, the stored image data A is read from the memory 1952 through the switch 1955 by the display controller 1956 with a frequency of 30 Hz to 60 Hz in general.

Next, for example, when data displayed on the screen is rewritten by a user (that is, in the case where the input image data A is changed), new image data (input image data B) is formed by the application processor. The input image data B is held in the memory 1953 through the switch 1954. The stored image data A is read periodically from the memory 1952 through the switch 1955 even during that time. After the completion of storing the new image data (the stored image data B) in the memory 1953, from the next frame for the display 1957, the stored image data B starts to be read, transmitted to the display 1957 through the switch 1955 and the display controller 1956, and displayed on the display 1957. This reading operation is continued until another new image data is held in the memory 1952.

By alternately writing and reading image data to and from the memory 1952 and the memory 1953 as described above, images are displayed on the display 1957. Note that the memory 1952 and the memory 1953 are not limited to separate memories, and a single memory may be divided and used. By employing the semiconductor device described in any of the above embodiments for the memory 1952 and the memory 1953, data can be written and read at high speed and held for a long time, and power consumption can be sufficiently reduced.

Next, FIG. 20 is a block diagram of an e-book reader. FIG. 20 includes a battery 2001, a power supply circuit 2002, a microprocessor 2003, a flash memory 2004, an audio circuit 2005, a keyboard 2006, a memory circuit 2007, a touch panel 2008, a display 2009, and a display controller 2010.

Here, the semiconductor device described in any of the above embodiments can be used for the memory circuit 2007 in FIG. 20. The memory circuit 2007 has a function of temporarily storing the contents of a book. For example, users use a highlight function in some cases. When users read an e-book reader, they sometimes want to mark a specified place. This marking refers to a highlight function, and users can make difference from other places by, for example, changing the color of a letter displayed, underlining a word, making a letter bold, or changing the font type of a letter. That is, there is a function of storing and holding information of a place specified by users. To save information for a long time, the information may be copied into the flash memory 2004. Even in such a case, by employing the semiconductor device described in any of the above embodiments, writing and reading of data can be performed at high speed, data can be held for a long time, and power consumption can be sufficiently reduced.

As described above, the semiconductor device in any of the above embodiments is mounted on each of the portable devices described in this embodiment. Thus, a portable device in which writing and reading of data are performed at high speed, data is held for a long time, and power consumption is sufficiently reduced, can be obtained.

The structures, methods, and the like described in this embodiment can be combined as appropriate with any of the structures, methods, and the like described in the other embodiments.

Embodiment 7

A semiconductor device disclosed in this specification can be applied to a variety of electronic appliances (including game machines). Examples of the electronic appliances include display devices of televisions, monitors, and the like, lighting devices, desktop personal computers and notebook personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, mobile phones, car phones, portable game machines, calculators, portable information terminals, electronic notebooks, e-book readers, electronic translators, audio input devices, cameras such as still cameras and video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. Further, the examples include industrial equipment such as guide lights, traffic lights, belt conveyors, elevators, escalators, industrial robots, and power storage systems. In addition, oil engines, moving objects driven by electric motors using power from the non-aqueous secondary batteries, and the like are also included in the category of electronic appliances. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic devices are illustrated in FIGS. 21A to 21C.

Figure 21A:
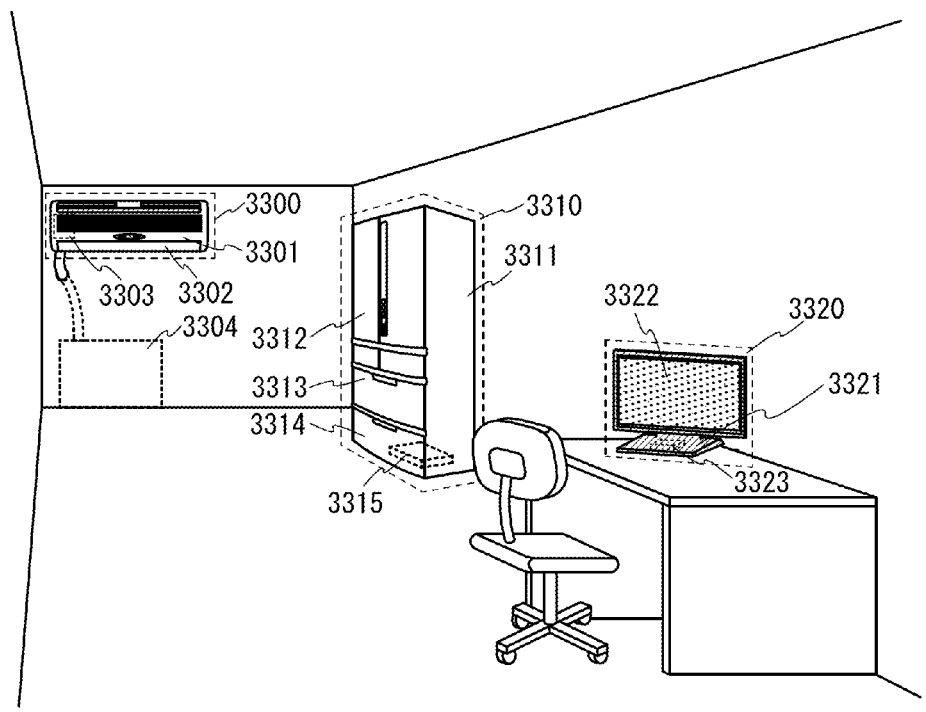
FIGS. 21A and 21B illustrate electronic devices.
Figure 21B:
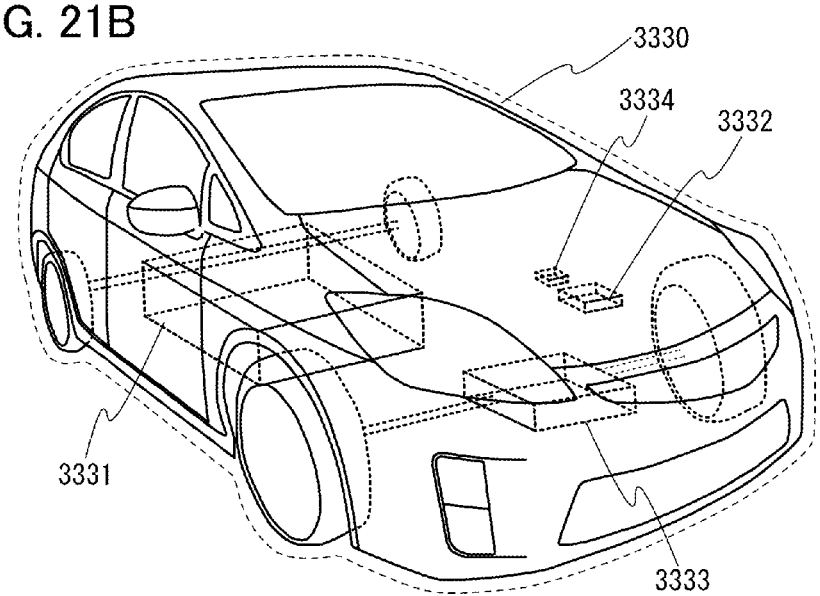

In FIG. 21A, an air conditioner which includes an indoor unit 3300 and an outdoor unit 3304 is an example of an electric appliance in which the CPU described in Embodiment 5 is used. Specifically, the indoor unit 3300 includes a housing 3301, an air outlet 3302, a CPU 3303, and the like. Although the CPU 3303 is provided in the indoor unit 3300 in FIG. 21A, the CPU 3303 may be provided in the outdoor unit 3304. Alternatively, the CPU 3303 may be provided in both the indoor unit 3300 and the outdoor unit 3304. As described in Embodiment 5, the CPU includes a transistor including an oxide semiconductor and thus can operate with low power consumption; accordingly, the power consumption of the air conditioner can be reduced.

In FIG. 21A, an electric refrigerator-freezer 3310 is an example of an electric appliance which is provided with the CPU formed using an oxide semiconductor. Specifically, the electric refrigerator-freezer 3310 includes a housing 3311, a door for a refrigerator 3312, a door for a freezer 3313, a door for a vegetable drawer 3314, a CPU 3315, and the like. In FIG. 21A, the CPU 3315 is provided in the housing 3311. When the CPU described in Embodiment 5 is used as the CPU 3315 of the electric refrigerator-freezer 3310, power consumption of the electric refrigerator-freezer 3310 can be reduced.

In FIG. 21A, an image display device 3320 is an example of an electric appliance which is provided with the CPU formed using an oxide semiconductor. Specifically, the image display device 3320 includes a housing 3321, a display portion 3322, a CPU 3323, and the like. In FIG. 21A, the CPU 3323 is provided in the housing 3321. When the CPU described in Embodiment 5 is used as the CPU 3323 of the image display device 3320, power consumption of the image display device 3320 can be reduced.

FIG. 21B illustrates an example of an electric vehicle which is an example of an electric appliance. An electric vehicle 3330 is equipped with a secondary battery 3331. The output of the electric power of the secondary battery 3331 is adjusted by a control circuit 3332 and the electric power is supplied to a driving device 3333. The control circuit 3332 is controlled by a processing unit 3334 including a ROM, a RAM, a CPU, or the like which is not illustrated. When the CPU described in Embodiment 5 is used as the CPU in the electric vehicle 3330, power consumption of the electric vehicle 3330 can be reduced.

The driving device 3333 includes a DC motor or an AC motor either alone or in combination with an internal-combustion engine. The processing unit 3334 outputs a control signal to the control circuit 3332 based on input data such as data of operation (e.g., acceleration, deceleration, or stop) by a driver or data during driving (e.g., data on an upgrade or a downgrade, or data on a load on a driving wheel) of the electric vehicle 3330. The control circuit 3332 adjusts the electric energy supplied from the secondary battery 3331 in accordance with the control signal of the processing unit 3334 to control the output of the driving device 3333. In the case where the AC motor is mounted, although not illustrated, an inverter which converts direct current into alternate current is also incorporated.

This embodiment can be implemented by being combined as appropriate with any of the other embodiments.

This application is based on Japanese Patent Application serial no. 2012-026737 filed with Japan Patent Office on Feb. 9, 2012, the entire contents of which are hereby incorporated by reference.

What is claimed is:

1. A semiconductor device comprising:
a first transistor including a first semiconductor material;
a first insulating film over the first transistor;
a second insulating film over the first insulating film;
a capacitor over the first insulating film; and
a second transistor over the second insulating film,
wherein the second transistor comprises:
    a semiconductor layer including a second semiconductor material;
    a third insulating film over the semiconductor layer;
    a gate electrode overlapping with the semiconductor layer with the third insulating film interposed therebetween;
    a source electrode in contact with the semiconductor layer; and
    a drain electrode in contact with the semiconductor layer,
wherein the capacitor is electrically connected to the second transistor,
wherein the capacitor comprises a first electrode, a second electrode, a fourth insulating film interposed between the first electrode and the second electrode, and a fifth insulating film interposed between the first electrode and the fourth insulating film,
wherein the fifth insulating film is over the second insulating film,
wherein a sixth insulating film including a silicon oxide is interposed between the fifth insulating film and the semiconductor layer,
wherein an entirety of the first electrode is overlapped with one of the source electrode and the drain electrode,
wherein the first electrode is embedded in the second insulating film, and
wherein the first semiconductor material and the second semiconductor material are different from each other.

2. The semiconductor device according to claim 1, wherein the second electrode is connected to one of the source electrode and the drain electrode.

3. The semiconductor device according to claim 1, wherein the second semiconductor material is an oxide semiconductor.

4. The semiconductor device according to claim 1, wherein the first semiconductor material is silicon.

5. The semiconductor device according to claim 1, further comprising a sidewall insulating film on a side surface of the gate electrode.

6. The semiconductor device according to claim 1, further comprising a sidewall insulating film on a side surface of the gate electrode,
wherein the semiconductor layer comprises a first region and a second region, the second region overlapping with the sidewall insulating film, and
wherein a resistance of the second region is lower than a resistance of the first region.

7. The semiconductor device according to claim 1, further comprising a sidewall insulating film on a side surface of the second electrode.

8. A semiconductor device comprising:
a first transistor including a first semiconductor material;
a first insulating film over the first transistor;
a second insulating film over the first insulating film;
a third insulating film over the second insulating film;
a capacitor over the first insulating film; and
a second transistor over the third insulating film,
wherein the second transistor comprises:
    a semiconductor layer including a second semiconductor material;
    a fourth insulating film over the semiconductor layer;
    a gate electrode overlapping with the semiconductor layer with the fourth insulating film interposed therebetween;
    a source electrode in contact with the semiconductor layer; and
    a drain electrode in contact with the semiconductor layer,
wherein the capacitor is electrically connected to the second transistor,
wherein the capacitor comprises a first electrode, a second electrode, a fifth insulating film interposed between the first electrode and the second electrode, and a sixth insulating film interposed between the first electrode and the fifth insulating film,
wherein the sixth insulating film is over the second insulating film,
wherein an entirety of the first electrode is overlapped with one of the source electrode and the drain electrode,
wherein the first electrode is embedded in the second insulating film,
wherein the second electrode and the fifth insulating film are in an opening provided in the third insulating film, and
wherein the first semiconductor material and the second semiconductor material are different from each other.

9. The semiconductor device according to claim 8, wherein the second electrode is connected to one of the source electrode and the drain electrode.

10. The semiconductor device according to claim 8, wherein the third insulating film includes a silicon oxide.

11. The semiconductor device according to claim 8, wherein the second semiconductor material is an oxide semiconductor.

12. The semiconductor device according to claim 8, wherein the first semiconductor material is silicon.

13. The semiconductor device according to claim 8, further comprising a sidewall insulating film on a side surface of the gate electrode.

14. The semiconductor device according to claim 8, further comprising a sidewall insulating film on a side surface of the gate electrode,
wherein the semiconductor layer comprises a first region and a second region, the second region overlapping with the sidewall insulating film, and
wherein a resistance of the second region is lower than a resistance of the first region.

15. The semiconductor device according to claim 8, further comprising a sidewall insulating film on a side surface of the second electrode.

* * * * *